US012604771B2

(12) United States Patent
Uzoh et al.

(10) Patent No.: US 12,604,771 B2
(45) Date of Patent: Apr. 14, 2026

(54) DIRECT BONDING METHODS AND STRUCTURES

(71) Applicant: ADEIA SEMICONDUCTOR BONDING TECHNOLOGIES INC., San Jose, CA (US)

(72) Inventors: Cyprian Emeka Uzoh, San Jose, CA (US); Jeremy Alfred Theil, Mountain View, CA (US); Gaius Gillman Fountain, Jr., Youngsville, NC (US); Dominik Suwito, San Jose, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 369 days.

(21) Appl. No.: 18/050,436

(22) Filed: Oct. 27, 2022

(65) Prior Publication Data

US 2023/0140107 A1 May 4, 2023

Related U.S. Application Data

(60) Provisional application No. 63/263,209, filed on Oct. 28, 2021.

(51) Int. Cl.
*H01L 23/00* (2006.01)
*H01L 25/065* (2023.01)

(52) U.S. Cl.
CPC .............. *H01L 24/80* (2013.01); *H01L 24/08* (2013.01); *H01L 24/94* (2013.01); *H01L 24/95* (2013.01);
(Continued)

(58) Field of Classification Search
CPC . H01L 2224/80948; H01L 2224/80001; H01L 2224/08145; H01L 21/2007;
(Continued)

(56) References Cited

U.S. PATENT DOCUMENTS 4,582,624 A * 4/1986 Enjo ................. H01L 21/31111
                                                          216/99
4,761,245 A * 8/1988 Scardera ........... H01L 21/31111
                                                          216/99
(Continued)

FOREIGN PATENT DOCUMENTS

CN        203895418 U    10/2014
CN        104246971 A    12/2014
(Continued)

OTHER PUBLICATIONS

Inoue, F. et al., "Influence of composition of SiCN as interfacial layer on plasma activated direct bonding," ECS Journal of Solid State Science and Technology, 2019, vol. 8, No. 6, pp. p. 346-p. 350.
(Continued)

*Primary Examiner* — Erin B Saad

(74) *Attorney, Agent, or Firm* — Knobbe, Martens, Olson & Bear, LLP

(57) ABSTRACT

Disclosed herein are methods for direct bonding. In some embodiments, the direct bonding method includes providing a first element having a first bonding surface, providing a second element having a second bonding surface, slightly etching the first bonding surface, treating the first bonding surface with a terminating liquid treatment to terminate the first bonding surface with a terminating species, and directly bonding the first bonding surface to the second bonding surface without the use of an intervening adhesive and without exposing the first bonding surface to plasma.

22 Claims, 14 Drawing Sheets

(52) U.S. Cl.
CPC .................... *H01L 25/0657* (2013.01); *H01L 2224/08145* (2013.01); *H01L 2224/80011* (2013.01); *H01L 2224/80031* (2013.01); *H01L 2224/80099* (2013.01); *H01L 2224/80895* (2013.01); *H01L 2224/80896* (2013.01); *H01L 2224/80948* (2013.01); *H01L 2224/94* (2013.01); *H01L 2224/95053* (2013.01); *H01L 2225/06524* (2013.01)

(58) Field of Classification Search
CPC ......... H01L 21/76251; H01L 21/31111; H01L 24/27; H01L 2225/06513; H01L 21/187; H01L 2224/83894; H01L 2224/81894; H01L 2225/06517; H01L 2224/80894; B23K 26/53; B08B 3/10
See application file for complete search history.

(56) References Cited

U.S. PATENT DOCUMENTS

| | | | |
|---|---|---|---|
| 5,051,802 A | 9/1991 | Prost et al. | |
| 5,753,536 A | 5/1998 | Sugiyama et al. | |
| 5,771,555 A | 6/1998 | Eda et al. | |
| 5,868,855 A * | 2/1999 | Fukazawa | H01L 21/02052 |
| | | | 257/E21.228 |
| 5,880,010 A * | 3/1999 | Davidson | H01L 24/26 |
| | | | 257/E21.705 |
| 6,080,640 A | 6/2000 | Gardner et al. | |
| 6,156,624 A * | 12/2000 | Yamagata | H01L 21/2007 |
| | | | 438/459 |
| 6,423,640 B1 | 7/2002 | Lee et al. | |
| 6,465,892 B1 | 10/2002 | Suga | |
| 6,630,074 B1 * | 10/2003 | Rath | H01L 21/31138 |
| | | | 257/E21.255 |
| 6,887,769 B2 | 5/2005 | Kellar et al. | |
| 6,908,027 B2 | 6/2005 | Tolchinsky et al. | |
| 6,984,571 B1 | 1/2006 | Enquist | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,550,366 B2 | 6/2009 | Suga et al. | |
| 7,582,971 B2 | 9/2009 | Kameyama et al. | |
| 7,663,231 B2 | 2/2010 | Chang et al. | |
| 7,686,912 B2 | 3/2010 | Suga et al. | |
| 7,750,488 B2 | 7/2010 | Patti et al. | |
| 7,759,751 B2 | 7/2010 | Ono | |
| 7,803,693 B2 | 9/2010 | Trezza | |
| 7,906,410 B2 | 3/2011 | Arita et al. | |
| 8,168,458 B2 | 5/2012 | Do et al. | |
| 8,183,127 B2 | 5/2012 | Patti et al. | |
| 8,193,632 B2 | 6/2012 | Chang et al. | |
| 8,263,434 B2 | 9/2012 | Pagaila et al. | |
| 8,268,699 B2 | 9/2012 | Park et al. | |
| 8,318,586 B2 | 11/2012 | Libralesso et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,505,197 B2 | 8/2013 | Blanchard | |
| 8,524,533 B2 | 9/2013 | Tong et al. | |
| 8,618,659 B2 | 12/2013 | Sato et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,791,575 B2 | 7/2014 | Oganesian et al. | |
| 8,802,538 B1 | 8/2014 | Liu | |
| 8,809,123 B2 | 8/2014 | Liu et al. | |
| 8,841,002 B2 | 9/2014 | Tong | |
| 8,866,305 B2 | 10/2014 | Sadaka et al. | |
| 8,878,353 B2 | 11/2014 | Haba et al. | |
| 9,018,079 B1 | 4/2015 | Lei et al. | |
| 9,076,860 B1 | 7/2015 | Lei et al. | |
| 9,093,350 B2 | 7/2015 | Endo et al. | |
| 9,136,293 B2 | 9/2015 | Yee et al. | |
| 9,142,459 B1 | 9/2015 | Kumar et al. | |
| 9,142,517 B2 | 9/2015 | Liu et al. | |
| 9,142,532 B2 | 9/2015 | Suga et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,252,172 B2 | 2/2016 | Chow et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,385,024 B2 | 7/2016 | Tong et al. | |
| 9,391,143 B2 * | 7/2016 | Tong | H01L 25/50 |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,476,898 B2 | 10/2016 | Takano | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,564,414 B2 * | 2/2017 | Enquist | H01L 24/30 |
| 9,620,481 B2 | 4/2017 | Edelstein et al. | |
| 9,656,852 B2 | 5/2017 | Cheng et al. | |
| 9,666,573 B1 | 5/2017 | Sukekawa et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,870,922 B2 | 1/2018 | Suga et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 9,971,777 B2 | 5/2018 | Bertin et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,269,853 B2 | 4/2019 | Katkar et al. | |
| 10,276,619 B2 | 4/2019 | Kao et al. | |
| 10,276,909 B2 | 4/2019 | Huang et al. | |
| 10,354,972 B2 | 7/2019 | Liu et al. | |
| 10,418,277 B2 | 9/2019 | Cheng et al. | |
| 10,434,749 B2 | 10/2019 | Tong | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,515,925 B2 | 12/2019 | Uzoh | |
| 10,522,499 B2 | 12/2019 | Enquist et al. | |
| 10,566,219 B2 | 2/2020 | Kurita et al. | |
| 10,622,327 B2 | 4/2020 | Yu et al. | |
| 10,707,087 B2 | 7/2020 | Uzoh et al. | |
| 10,714,449 B2 | 7/2020 | Uzoh | |
| 10,727,219 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,937,755 B2 | 3/2021 | Shah et al. | |
| 10,950,547 B2 | 3/2021 | Mohammed et al. | |
| 10,964,664 B2 | 3/2021 | Mandalapu et al. | |

(56) References Cited

U.S. PATENT DOCUMENTS

| | | | |
|---|---|---|---|
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,004,757 B2 | 5/2021 | Katkar et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,606 B2 | 10/2021 | Gao et al. | |
| 11,171,117 B2 | 11/2021 | Gao et al. | |
| 11,176,450 B2 | 11/2021 | Teig et al. | |
| 11,256,004 B2 | 2/2022 | Haba et al. | |
| 11,264,357 B1 | 3/2022 | DeLaCruz et al. | |
| 11,276,676 B2* | 3/2022 | Enquist | H10F 39/026 |
| 11,329,034 B2 | 5/2022 | Tao et al. | |
| 11,348,898 B2 | 5/2022 | DeLaCruz et al. | |
| 11,355,443 B2 | 6/2022 | Huang et al. | |
| 11,664,357 B2 | 5/2023 | Fountain, Jr. et al. | |
| 11,710,718 B2 | 7/2023 | Uzoh | |
| 11,742,314 B2 | 8/2023 | Uzoh et al. | |
| 11,742,315 B2 | 8/2023 | Uzoh | |
| 11,855,064 B2 | 12/2023 | Uzoh et al. | |
| 11,990,463 B2 | 5/2024 | Wimplinger | |
| 12,009,338 B2* | 6/2024 | Gao | H01L 23/562 |
| 12,300,661 B2 | 5/2025 | Uzoh et al. | |
| 12,406,975 B2 | 9/2025 | Uzoh et al. | |
| 12,431,460 B2 | 9/2025 | Uzoh | |
| 2002/0003307 A1 | 1/2002 | Suga | |
| 2002/0048906 A1 | 4/2002 | Sakai et al. | |
| 2002/0053730 A1 | 5/2002 | Mashino | |
| 2002/0117655 A1* | 8/2002 | Yoshimatsu | H03H 9/174 |
| | | | 257/1 |
| 2004/0084414 A1 | 5/2004 | Sakai et al. | |
| 2004/0202405 A1* | 10/2004 | Ogawa | G02B 6/3502 |
| | | | 385/16 |
| 2004/0235266 A1 | 11/2004 | Tong | |
| 2005/0009246 A1 | 1/2005 | Enquist et al. | |
| 2005/0031795 A1 | 2/2005 | Chaudhury et al. | |
| 2006/0057945 A1 | 3/2006 | Hsu et al. | |
| 2006/0087042 A1 | 4/2006 | Kameyama et al. | |
| 2006/0234473 A1 | 10/2006 | Wong et al. | |
| 2007/0075417 A1 | 4/2007 | Hwang et al. | |
| 2007/0111386 A1 | 5/2007 | Kim et al. | |
| 2007/0111476 A1 | 5/2007 | Sugiura et al. | |
| 2007/0224733 A1 | 9/2007 | Boyle et al. | |
| 2008/0245408 A1 | 10/2008 | Ito et al. | |
| 2008/0308928 A1 | 12/2008 | Chang | |
| 2009/0186216 A1 | 7/2009 | Inada et al. | |
| 2009/0227089 A1 | 9/2009 | Plaut et al. | |
| 2009/0298264 A1 | 12/2009 | Arai et al. | |
| 2010/0167534 A1 | 7/2010 | Iwata | |
| 2011/0147984 A1* | 6/2011 | Cheng | B82Y 40/00 |
| | | | 264/220 |
| 2011/0175243 A1 | 7/2011 | Jo et al. | |
| 2011/0230005 A1 | 9/2011 | Vaufredaz et al. | |
| 2012/0077329 A1 | 3/2012 | Broekaart et al. | |
| 2012/0187516 A1 | 7/2012 | Sato | |
| 2012/0194719 A1 | 8/2012 | Churchwell et al. | |
| 2013/0026643 A1 | 1/2013 | England et al. | |
| 2013/0153093 A1 | 6/2013 | Vandroux et al. | |
| 2013/0252399 A1 | 9/2013 | Leduc et al. | |
| 2013/0270328 A1 | 10/2013 | Di Cioccio et al. | |
| 2014/0001949 A1 | 1/2014 | Kimura et al. | |
| 2014/0011324 A1 | 1/2014 | Liu et al. | |
| 2014/0175655 A1 | 6/2014 | Chen et al. | |
| 2014/0312511 A1 | 10/2014 | Nakamura et al. | |
| 2014/0314370 A1 | 10/2014 | Hatori et al. | |
| 2015/0031189 A1 | 1/2015 | Chen et al. | |
| 2015/0064498 A1 | 3/2015 | Tong | |
| 2015/0118825 A1 | 4/2015 | Ishizuka | |

| | | | |
|---|---|---|---|
| 2015/0132953 A1* | 5/2015 | Nowling | H01L 21/32133 |
| | | | 438/692 |
| 2015/0243611 A1 | 8/2015 | Liu et al. | |
| 2015/0255349 A1 | 9/2015 | Holden et al. | |
| 2015/0279816 A1 | 10/2015 | Chen et al. | |
| 2015/0314385 A1 | 11/2015 | Abe et al. | |
| 2016/0126218 A1 | 5/2016 | Kurita | |
| 2016/0181228 A1* | 6/2016 | Higuchi | H01L 25/0657 |
| | | | 257/774 |
| 2016/0190103 A1 | 6/2016 | Kabe et al. | |
| 2016/0343682 A1 | 11/2016 | Kawasaki | |
| 2017/0087585 A1* | 3/2017 | Dattilo | B08B 7/0057 |
| 2017/0170132 A1* | 6/2017 | Enquist | H01L 23/13 |
| 2018/0005977 A1 | 1/2018 | Lin et al. | |
| 2018/0012787 A1 | 1/2018 | Oka et al. | |
| 2018/0151382 A1* | 5/2018 | Liu | H01L 21/0337 |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0219038 A1 | 8/2018 | Gambino et al. | |
| 2018/0308819 A1 | 10/2018 | Uzoh | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0043914 A1 | 2/2019 | Von Känel | |
| 2019/0051628 A1 | 2/2019 | Liu et al. | |
| 2019/0088527 A1* | 3/2019 | Uzoh | H01L 25/50 |
| 2019/0096741 A1 | 3/2019 | Uzoh et al. | |
| 2019/0115277 A1 | 4/2019 | Yu et al. | |
| 2019/0131277 A1 | 5/2019 | Yang et al. | |
| 2019/0157333 A1 | 5/2019 | Tsai | |
| 2019/0198409 A1 | 6/2019 | Katkar et al. | |
| 2019/0199058 A1 | 6/2019 | Pierer et al. | |
| 2019/0248698 A1* | 8/2019 | Tsunetomo | C03B 33/02 |
| 2019/0252364 A1 | 8/2019 | Uzoh et al. | |
| 2019/0265411 A1 | 8/2019 | Huang et al. | |
| 2019/0287788 A1 | 9/2019 | Lin et al. | |
| 2019/0326252 A1 | 10/2019 | Mandalapu et al. | |
| 2019/0333550 A1 | 10/2019 | Fisch | |
| 2019/0344533 A1 | 11/2019 | Tong | |
| 2019/0358955 A1 | 11/2019 | Giusti et al. | |
| 2019/0371761 A1 | 12/2019 | Uzoh et al. | |
| 2019/0385935 A1 | 12/2019 | Gao et al. | |
| 2019/0385966 A1 | 12/2019 | Gao et al. | |
| 2020/0006266 A1 | 1/2020 | Chen et al. | |
| 2020/0013637 A1 | 1/2020 | Haba | |
| 2020/0013754 A1 | 1/2020 | Gao et al. | |
| 2020/0013765 A1 | 1/2020 | Fountain, Jr. et al. | |
| 2020/0035641 A1 | 1/2020 | Fountain, Jr. et al. | |
| 2020/0075520 A1 | 3/2020 | Gao et al. | |
| 2020/0075553 A1 | 3/2020 | DeLaCruz et al. | |
| 2020/0118973 A1 | 4/2020 | Wang et al. | |
| 2020/0126906 A1 | 4/2020 | Uzoh et al. | |
| 2020/0194396 A1 | 6/2020 | Uzoh | |
| 2020/0227367 A1 | 7/2020 | Haba et al. | |
| 2020/0243380 A1 | 7/2020 | Uzoh et al. | |
| 2020/0279821 A1 | 9/2020 | Haba et al. | |
| 2020/0294908 A1 | 9/2020 | Haba et al. | |
| 2020/0299127 A1 | 9/2020 | Brioschi et al. | |
| 2020/0321307 A1 | 10/2020 | Uzoh | |
| 2020/0328162 A1 | 10/2020 | Haba et al. | |
| 2020/0328164 A1 | 10/2020 | DeLaCruz et al. | |
| 2020/0328165 A1 | 10/2020 | DeLaCruz et al. | |
| 2020/0335408 A1 | 10/2020 | Gao et al. | |
| 2020/0371154 A1 | 11/2020 | DeLaCruz et al. | |
| 2020/0395321 A1 | 12/2020 | Katkar et al. | |
| 2020/0411483 A1 | 12/2020 | Uzoh et al. | |
| 2021/0098412 A1* | 4/2021 | Haba | H01L 21/6835 |
| 2021/0118864 A1 | 4/2021 | DeLaCruz et al. | |
| 2021/0143125 A1 | 5/2021 | DeLaCruz et al. | |
| 2021/0175280 A1 | 6/2021 | Chae et al. | |
| 2021/0181510 A1 | 6/2021 | Katkar et al. | |
| 2021/0193603 A1 | 6/2021 | Katkar et al. | |
| 2021/0193624 A1 | 6/2021 | DeLaCruz et al. | |
| 2021/0193625 A1 | 6/2021 | DeLaCruz et al. | |
| 2021/0202567 A1 | 7/2021 | Kim et al. | |
| 2021/0242152 A1 | 8/2021 | Fountain, Jr. et al. | |

(56) References Cited

U.S. PATENT DOCUMENTS

| | | | |
|---|---|---|---|
| 2021/0296282 A1* | 9/2021 | Gao | H01L 23/562 |
| 2021/0305202 A1 | 9/2021 | Uzoh et al. | |
| 2021/0366820 A1 | 11/2021 | Uzoh | |
| 2021/0375850 A1 | 12/2021 | Uzoh et al. | |
| 2021/0407941 A1 | 12/2021 | Haba | |
| 2022/0077063 A1 | 3/2022 | Haba | |
| 2022/0077087 A1 | 3/2022 | Haba | |
| 2022/0139867 A1* | 5/2022 | Uzoh | H01L 24/80 |
| | | | 438/107 |
| 2022/0139869 A1 | 5/2022 | Gao et al. | |
| 2022/0208650 A1 | 6/2022 | Gao et al. | |
| 2022/0208702 A1 | 6/2022 | Uzoh | |
| 2022/0208723 A1 | 6/2022 | Katkar et al. | |
| 2022/0246497 A1 | 8/2022 | Fountain, Jr. et al. | |
| 2022/0285303 A1 | 9/2022 | Mirkarimi et al. | |
| 2022/0319901 A1 | 10/2022 | Suwito et al. | |
| 2022/0320035 A1 | 10/2022 | Uzoh et al. | |
| 2022/0320036 A1 | 10/2022 | Gao et al. | |
| 2023/0005850 A1 | 1/2023 | Fountain, Jr. | |
| 2023/0019869 A1 | 1/2023 | Mirkarimi et al. | |
| 2023/0036441 A1 | 2/2023 | Haba et al. | |
| 2023/0067677 A1 | 3/2023 | Lee et al. | |
| 2023/0069183 A1* | 3/2023 | Haba | H01L 23/5385 |
| 2023/0100032 A1 | 3/2023 | Haba et al. | |
| 2023/0115122 A1 | 4/2023 | Uzoh et al. | |
| 2023/0122531 A1 | 4/2023 | Uzoh | |
| 2023/0123423 A1* | 4/2023 | Gao | H01L 23/645 |
| | | | 257/428 |
| 2023/0125395 A1 | 4/2023 | Gao et al. | |
| 2023/0130259 A1 | 4/2023 | Haba et al. | |
| 2023/0132632 A1* | 5/2023 | Katkar | H01L 24/05 |
| | | | 257/690 |
| 2023/0140107 A1* | 5/2023 | Uzoh | H01L 21/6836 |
| | | | 228/206 |
| 2023/0142680 A1 | 5/2023 | Guevara et al. | |
| 2023/0154816 A1 | 5/2023 | Haba et al. | |
| 2023/0154828 A1 | 5/2023 | Haba et al. | |
| 2023/0187264 A1 | 6/2023 | Uzoh et al. | |
| 2023/0187317 A1 | 6/2023 | Uzoh | |
| 2023/0187412 A1 | 6/2023 | Gao et al. | |
| 2023/0197453 A1 | 6/2023 | Fountain, Jr. et al. | |
| 2023/0197496 A1 | 6/2023 | Theil | |
| 2023/0197559 A1 | 6/2023 | Haba et al. | |
| 2023/0197560 A1 | 6/2023 | Katkar et al. | |
| 2023/0197655 A1 | 6/2023 | Theil et al. | |
| 2023/0207402 A1 | 6/2023 | Fountain, Jr. et al. | |
| 2023/0207437 A1 | 6/2023 | Haba | |
| 2023/0207474 A1 | 6/2023 | Uzoh et al. | |
| 2023/0207514 A1 | 6/2023 | Gao et al. | |
| 2023/0215836 A1 | 7/2023 | Haba et al. | |
| 2023/0245950 A1 | 8/2023 | Haba et al. | |
| 2023/0268300 A1 | 8/2023 | Uzoh et al. | |
| 2023/0299029 A1 | 9/2023 | Theil et al. | |
| 2023/0343734 A1 | 10/2023 | Uzoh et al. | |
| 2023/0360950 A1 | 11/2023 | Gao | |
| 2023/0361074 A1 | 11/2023 | Uzoh et al. | |
| 2023/0369136 A1 | 11/2023 | Uzoh et al. | |
| 2023/0375613 A1 | 11/2023 | Haba et al. | |
| 2024/0021572 A1 | 1/2024 | Uzoh | |
| 2024/0021573 A1 | 1/2024 | Uzoh et al. | |
| 2024/0038702 A1 | 2/2024 | Uzoh | |
| 2024/0055407 A1 | 2/2024 | Workman | |
| 2024/0079376 A1 | 3/2024 | Suwito et al. | |
| 2024/0105674 A1 | 3/2024 | Uzoh et al. | |
| 2024/0170411 A1 | 5/2024 | Chang et al. | |
| 2024/0186248 A1 | 6/2024 | Haba et al. | |
| 2024/0186268 A1 | 6/2024 | Uzoh et al. | |
| 2024/0186269 A1 | 6/2024 | Haba | |
| 2024/0203917 A1 | 6/2024 | Katkar et al. | |
| 2024/0213191 A1 | 6/2024 | Theil et al. | |
| 2024/0213210 A1 | 6/2024 | Haba et al. | |
| 2024/0217210 A1 | 7/2024 | Zhao et al. | |
| 2024/0222239 A1 | 7/2024 | Gao et al. | |
| 2024/0222315 A1 | 7/2024 | Uzoh | |
| 2024/0222319 A1 | 7/2024 | Gao et al. | |

| | | |
|---|---|---|
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0371850 A1 | 11/2024 | Uzoh et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0112123 A1 | 4/2025 | Katkar et al. |
| 2025/0185163 A1 | 6/2025 | Zhao et al. |
| 2025/0210585 A1 | 6/2025 | Fountain, Jr. et al. |
| 2025/0212554 A1 | 6/2025 | Katkar et al. |
| 2025/0218903 A1 | 7/2025 | Uzoh et al. |
| 2025/0226356 A1 | 7/2025 | Uzoh et al. |
| 2025/0273517 A1 | 8/2025 | Lee et al. |

FOREIGN PATENT DOCUMENTS

| | | |
|---|---|---|
| CN | 106409650 A | 2/2017 |
| CN | 107331759 A | 11/2017 |
| EP | 1011133 A1 | 6/2000 |
| JP | 2002-353416 A | 12/2002 |
| JP | 2008-130603 A | 6/2008 |
| JP | 2008-244080 A | 10/2008 |
| JP | 2009-514185 A | 4/2009 |
| JP | 2011-104633 A | 6/2011 |
| JP | 2013-033786 A | 2/2013 |
| JP | 2015-517217 A | 6/2015 |
| JP | 2016-072316 A | 5/2016 |
| JP | 2018-160519 | 10/2018 |
| TW | 201401573 A | 1/2014 |
| TW | 201423873 A | 6/2014 |
| TW | 201612965 A | 4/2016 |
| WO | WO 00/59006 A1 | 10/2000 |
| WO | WO 2005/043584 A2 | 5/2005 |
| WO | WO 2007/021639 A2 | 2/2007 |
| WO | WO 2008/112101 A2 | 9/2008 |
| WO | WO 2009/158378 A2 | 12/2009 |
| WO | WO 2013/021251 A1 | 2/2013 |
| WO | WO 2012/133760 A1 | 7/2014 |
| WO | WO 2016/003709 A1 | 1/2016 |
| WO | WO 2018/194827 A1 | 10/2018 |

OTHER PUBLICATIONS

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.

Plobi, A. et al., "Wafer direct bonding: tailoring adhesion between brittle materials," Materials Science and Engineering Review Journal, 1999, R25, 88 pages.

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding

(56) References Cited

OTHER PUBLICATIONS for system level packaging," The University of Tokyo, Research Center for Science and Technology, 2000 Electronic Components and Technology Conference, 2000 IEEE, pp. 702-705.

Bush, Steve, "Electronica: Automotive power modules from on Semi," ElectronicsWeekly.com, indicating an ONSEMI AR0820 product was to be demonstrated at a |Nov. 2018 trade show, https://www.electronicsweekly.com/news/products/power-supplies/electronica-automotive-power-modules-semi-2018-11/ (published Nov. 8, 2018; downloaded Jul. 26, 2023).

Claims from U.S. Appl. No. 17/452,753, filed Oct. 28, 2021 (Year: 2021); 4 pages.

Claims from U.S. Appl. No. 17/657,332, filed Jun. 7, 2022 (Year : 2022); 4 pages.

Ghernaout, D., "The hydrophilic/hydrophobic ratio vs. dissolved organics removal by coagulation—A review". J King Saud University-Science. Jul. 1, 2014;26(3): 169-180.

Geyer et al., "When and how self-cleaning superhydrophobic surfaces works". Sci Adv Jan. 17, 2020;6:eaaw9727 (11 pages).

Lei, Wei-Sheng et al., "Die singulation technologies for advanced packaging: A critical review," J. Vac. Sci. Technol. B, Jul./Aug. 2012, vol. 30, No. 4, pp. 040801-1-040801-27.

Luo, X. et al., "High-throughput multiple dies-to-wafer bonding technology and III/V-on-Si hybrid lasers for heterogeneous integration of optoelectronic integrated circuits," Frontiers in Materials, Apr. 2015, vol. 2, Article 28, pp. 1-21.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "Onsemi AR0820."

Sony IMX260 images, showing various cross sections and materials analyses for a hybrid bonded back side illuminated CMOS image sensor. The part in the images was shipped in Apr. 2016. Applicant makes No. representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).

* cited by examiner

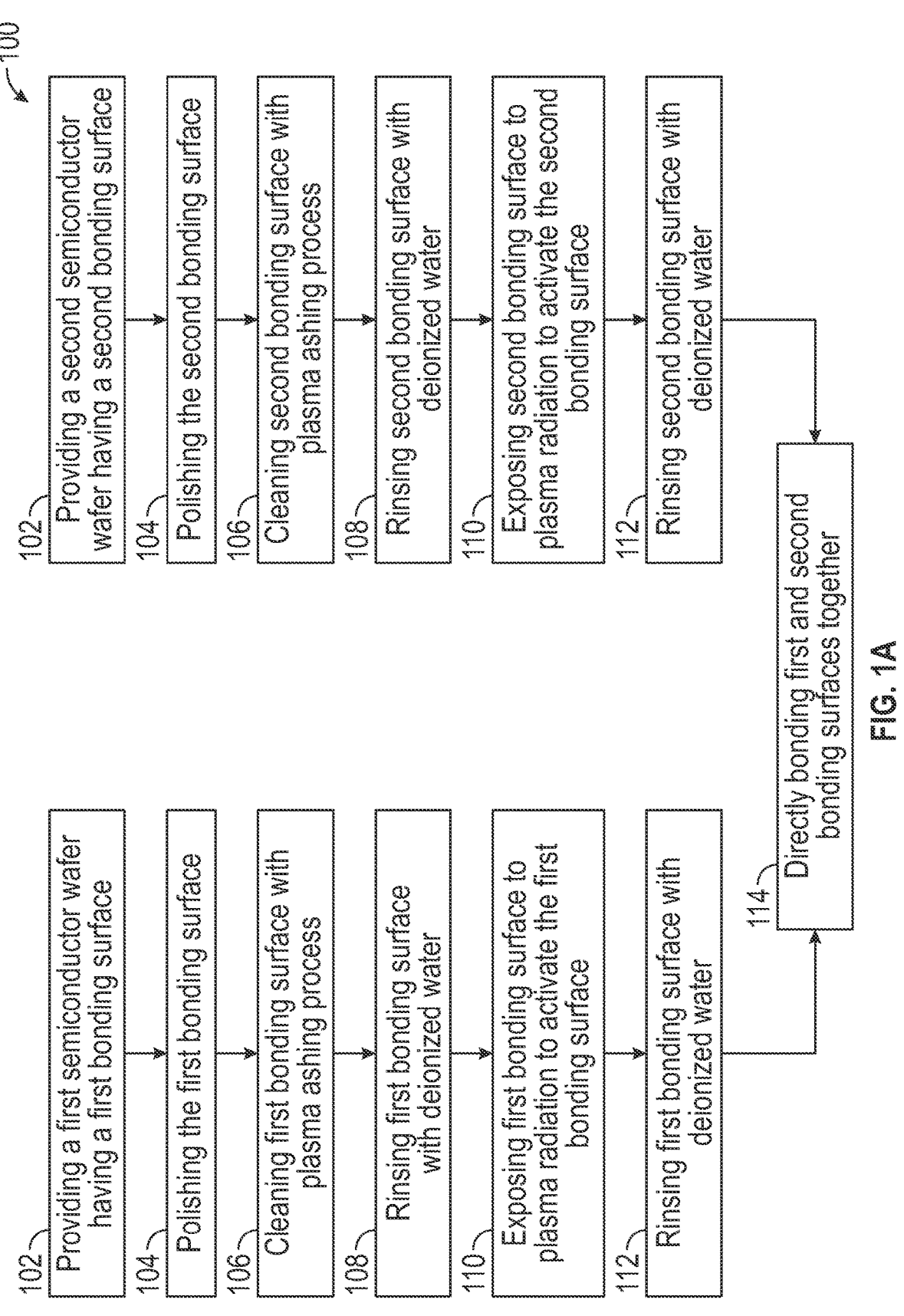

100

102 Providing a first semiconductor wafer having a first bonding surface

104 Polishing the first bonding surface

106 Cleaning first bonding surface with plasma ashing process

108 Rinsing first bonding surface with deionized water

110 Exposing first bonding surface to plasma radiation to activate the first bonding surface 112 Rinsing first bonding surface with deionized water 102 Providing a second semiconductor wafer having a second bonding surface 104 Polishing the second bonding surface 106 Cleaning second bonding surface with plasma ashing process 108 Rinsing second bonding surface with deionized water 110 Exposing second bonding surface to plasma radiation to activate the second bonding surface 112 Rinsing second bonding surface with deionized water 114 Directly bonding first and second bonding surfaces together

FIG. 1A

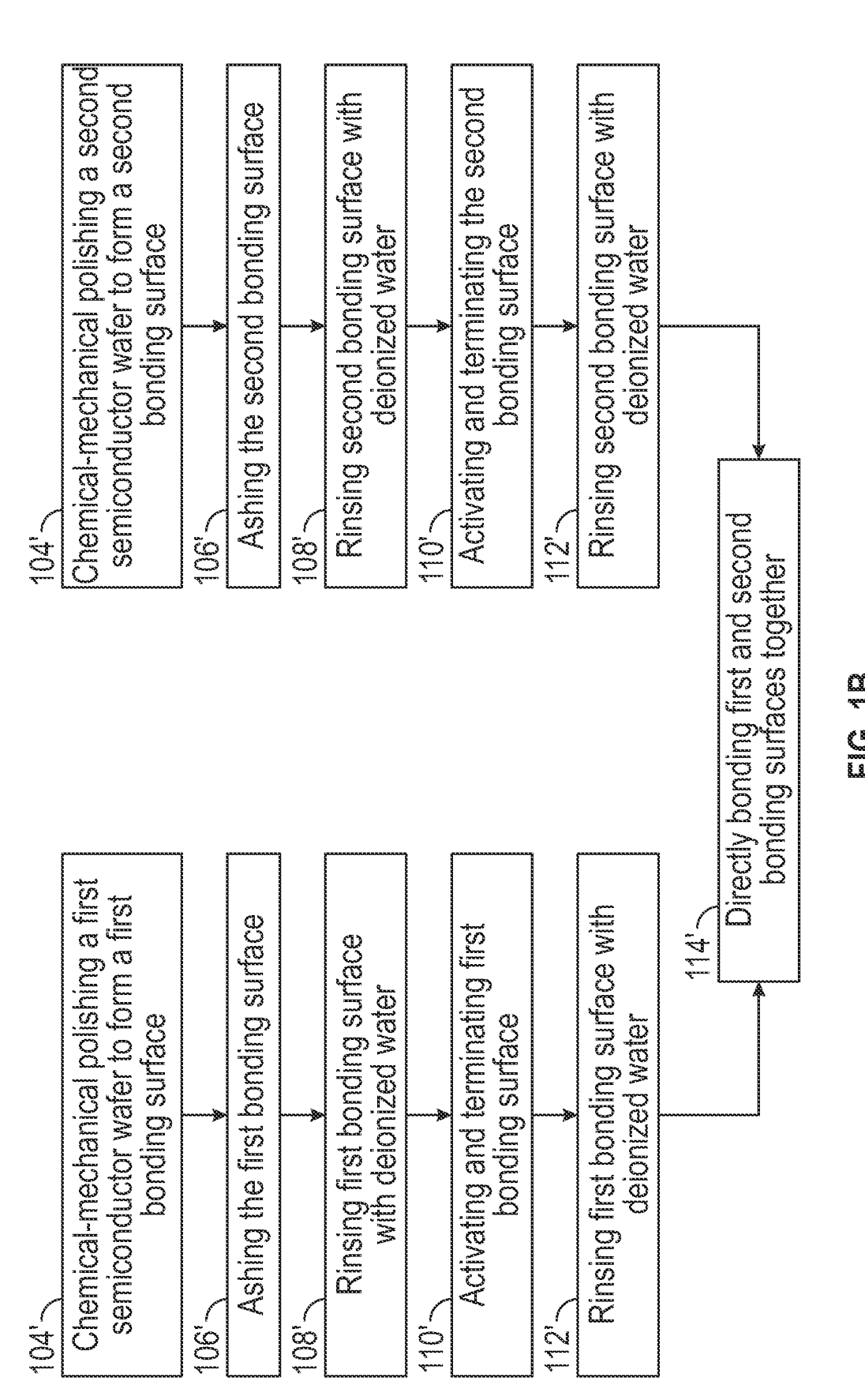

100'

104' Chemical-mechanical polishing a second semiconductor wafer to form a second bonding surface 106' Ashing the second bonding surface 108' Rinsing second bonding surface with deionized water 110' Activating and terminating the second bonding surface 112' Rinsing second bonding surface with deionized water 104' Chemical-mechanical polishing a first semiconductor wafer to form a first bonding surface 106' Ashing the first bonding surface 108' Rinsing first bonding surface with deionized water 110' Activating and terminating first bonding surface 112' Rinsing first bonding surface with deionized water 114' Directly bonding first and second bonding surfaces together

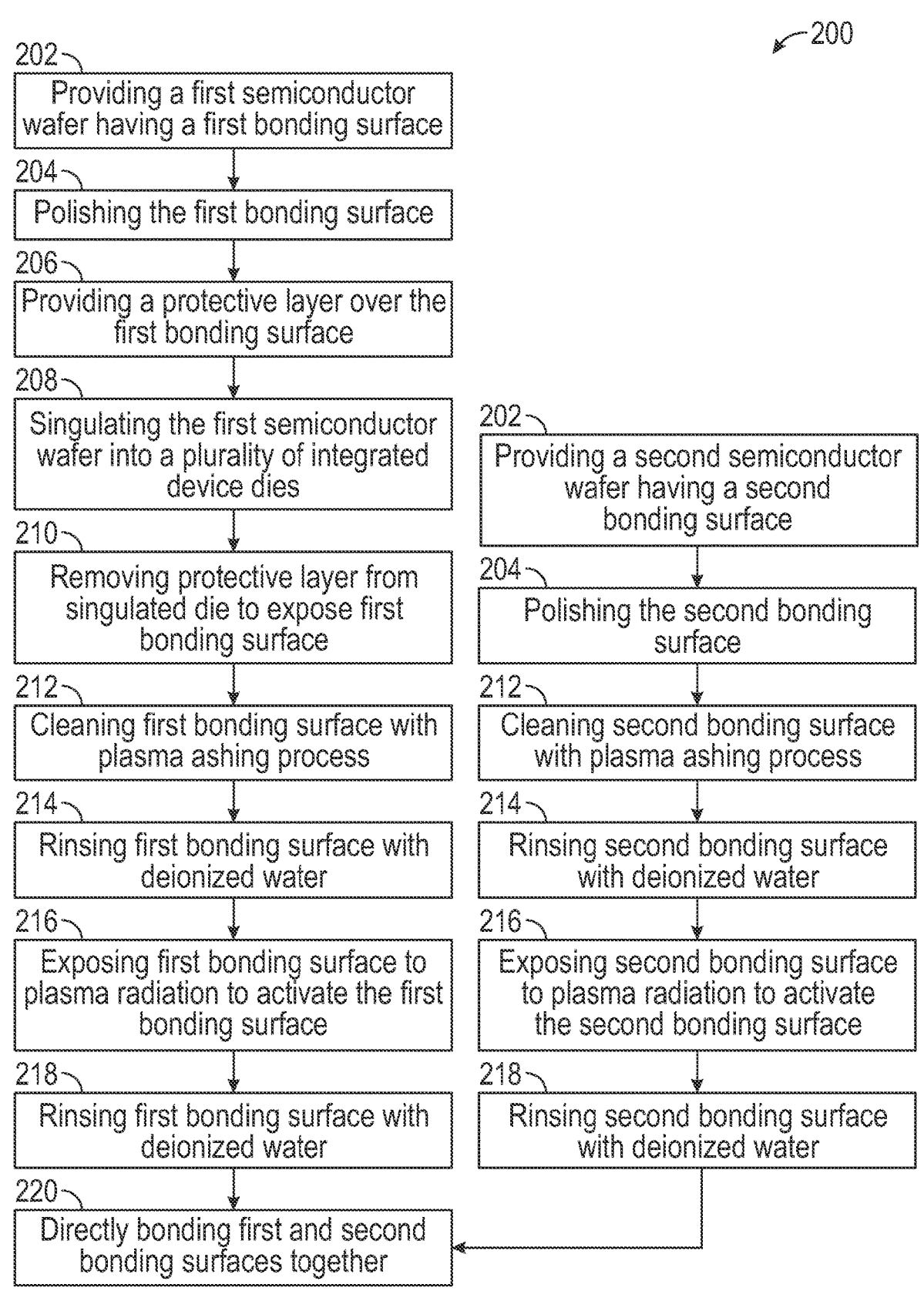

202
Providing a first semiconductor wafer having a first bonding surface

204
Polishing the first bonding surface

206
Providing a protective layer over the first bonding surface

208
Singulating the first semiconductor wafer into a plurality of integrated device dies 210
Removing protective layer from singulated die to expose first bonding surface 212
Cleaning first bonding surface with plasma ashing process 214
Rinsing first bonding surface with deionized water 216
Exposing first bonding surface to plasma radiation to activate the first bonding surface 218
Rinsing first bonding surface with deionized water 202
Providing a second semiconductor wafer having a second bonding surface 204
Polishing the second bonding surface 212
Cleaning second bonding surface with plasma ashing process 214
Rinsing second bonding surface with deionized water 216
Exposing second bonding surface to plasma radiation to activate the second bonding surface 218
Rinsing second bonding surface with deionized water 220
Directly bonding first and second bonding surfaces together

FIG. 2A

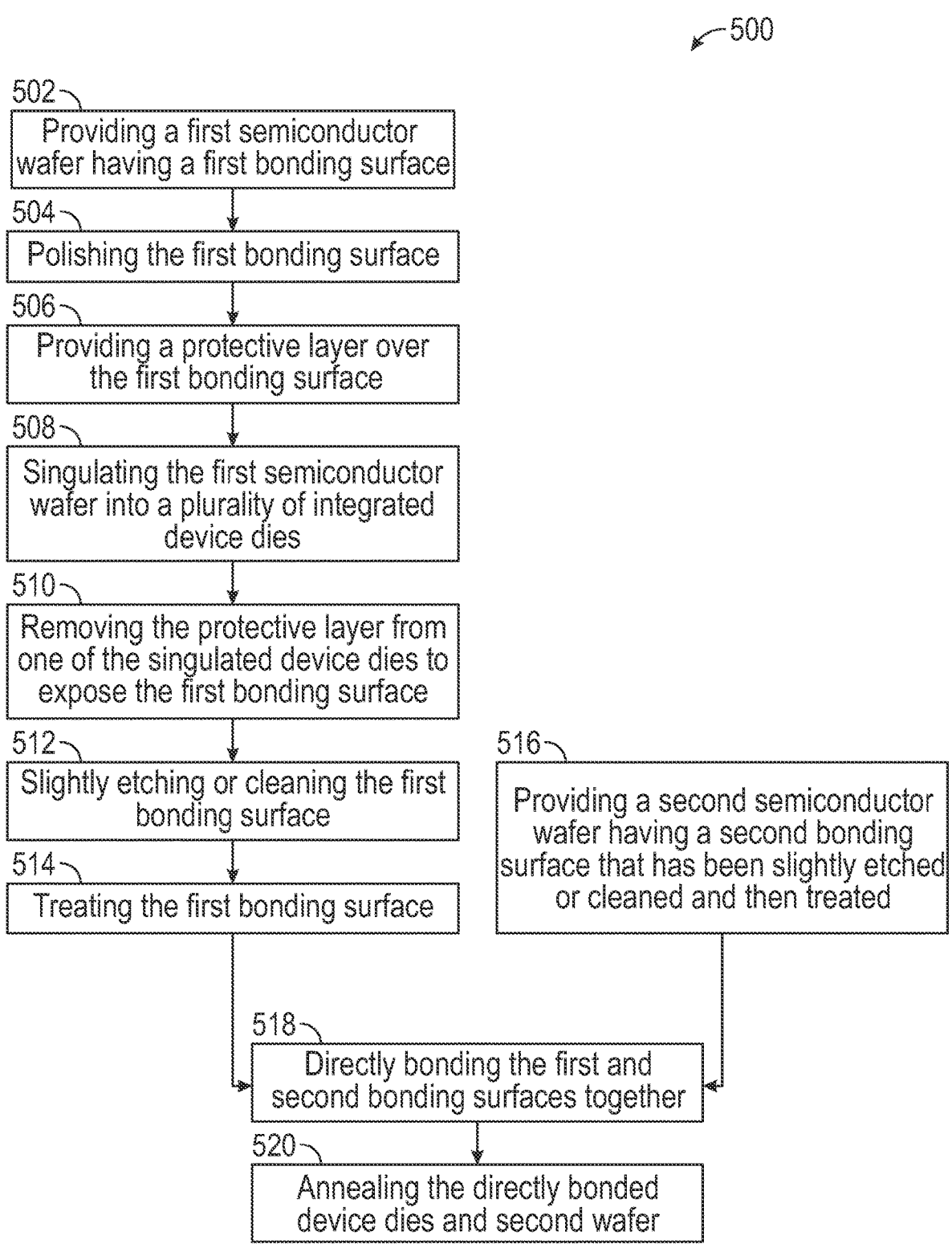

502 — Providing a first semiconductor wafer having a first bonding surface

504 — Polishing the first bonding surface

506 — Providing a protective layer over the first bonding surface

508 — Singulating the first semiconductor wafer into a plurality of integrated device dies 510 — Removing the protective layer from one of the singulated device dies to expose the first bonding surface 512 — Slightly etching or cleaning the first bonding surface 514 — Treating the first bonding surface 516 — Providing a second semiconductor wafer having a second bonding surface that has been slightly etched or cleaned and then treated 518 — Directly bonding the first and second bonding surfaces together 520 — Annealing the directly bonded device dies and second wafer

DIRECT BONDING METHODS AND STRUCTURES

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 157.

This application claims the benefit under 35 U.S.C. § 119(e) to U.S. Provisional Application No. 63/263,209, entitled "DIRECT BONDING METHODS AND STRUCTURES," filed Oct. 28, 2021, the entirety of which is hereby incorporated by reference herein.

BACKGROUND

Field

The field relates to direct bonding methods and structures

Description of the Related Art

Microelectronic elements often comprise a thin piece of a semiconductor material, such as silicon or gallium arsenide or others. Chips and dies are commonly provided as individual, prepackaged units. In some unit designs, the die is mounted to a substrate or a chip carrier, which is in turn mounted on a circuit panel, such as a printed circuit board (PCB). Dies can be provided in packages that facilitate handling of the die during manufacture and during mounting of the die on the external substrate. For example, many dies are provided in packages suitable for surface mounting. The die can be mounted to the substrate by way of intervening solder balls.

Semiconductor dies can also be provided in "stacked" arrangements, wherein one die is provided on a carrier, for example, and another die is mounted on top of the first die. These arrangements can allow a number of different dies to be mounted within a single footprint on a circuit board and can further facilitate high-speed operation by providing a short interconnection between the dies. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package). This has been done, for example, by providing contact pads or lands on both sides of the substrate to which the die is mounted, the pads being connected through the substrate by conductive vias or the like.

Dies or wafers may also be stacked in other three-dimensional arrangements as part of various microelectronic packaging schemes. This can include stacking layers of one or more dies or wafers on a larger base die or wafer, stacking multiple dies or wafers in vertical or horizontal arrangements, or stacking similar or dissimilar substrates, where one or more of the substrates may contain electrical or non-electrical elements, optical or mechanical elements, and/or various combinations of these. Dies or wafers may be bonded in a stacked arrangement using various bonding techniques, including direct dielectric bonding, non-adhesive techniques, such as ZiBond® or a hybrid direct bonding technique, such as DBI®, both available from Adeia (see for example, U.S. Pat. Nos. 6,864,585 and 7,485,968, which are incorporated herein in their entirety). When bonding stacked dies using a direct bonding technique, it is usually desirable that the surfaces of the dies to be bonded be extremely flat and smooth. For instance, in general, the surfaces should have a very low variance in surface topology, so that the surfaces can be closely mated to form a lasting bond. For example, it is generally preferable that the variation in roughness of the bonding surfaces be less than 3 nm and preferably less than 1.0 nm.

SUMMARY OF THE INVENTION

In one embodiment, a bonding method can include: providing a first element having a first bonding surface, the first bonding surface comprising a first nonconductive field region and a first plurality of contact features; providing a second element having a second bonding surface, the second bonding surface comprising a second nonconductive field region and a second plurality of contact features; slightly etching the first bonding surface of the first element with a liquid etchant to activate the first bonding surface; after the slightly etching, treating the first bonding surface with a terminating liquid treatment to terminate the first bonding surface with a terminating species; and after the treating, directly bonding the first bonding surface to the second bonding surface such that the first and second nonconductive field regions are directly bonded to one another without an intervening adhesive and such that the first and second pluralities of contact features are directly bonded to one another without an intervening adhesive.

In some embodiments, the first bonding surface of the first element is not exposed to an oxygen plasma before the direct bonding. In some embodiments, the first bonding surface of the first element is not exposed to a nitrogen plasma before the direct bonding. In some embodiments, the first bonding surface of the first element is not exposed to a plasma treatment after forming the first bonding surface and before the direct bonding. In some embodiments, slightly etching comprises exposing the first bonding surface to hydrofluoric acid (HF) (e.g., a chemical formulation comprising very dilute HF, buffered hydrofluoric acid, ammonium fluoride, or very dilute HF moieties). In some embodiments, exposing the first bonding surface to HF comprises exposing the first bonding surface to a dilute HF solution having a concentration of HF in a range of 15 to 500 ppm. In some embodiments, treating the first bonding surface comprises treating the first bonding surface with tetramethylammonium hydroxide (TMAH). In some embodiments, treating the first bonding surface with TMAH comprises exposing the first bonding surface to a TMAH solution having a concentration of TMAH of less than 100 ppm. In some embodiments, exposing the first bonding surface to the TMAH solution comprises exposing the first bonding surface to the TMAH solution having a concentration of TMAH in a range of 5 ppm to 100 ppm. In some embodiments, treating the first bonding surface comprises treating the first bonding surface with a boron-containing solution. In some embodiments, treating the first bonding surface with the boron-containing solution comprises treating the first bonding surface with boric acid. In some embodiments, treating the first bonding surface with boric acid comprises treating the first bonding surface with a boric acid solution having a concentration of boric acid in a range of 0.5 ppm to 100 ppm. In some embodiments, treating the first bonding surface with the boron-containing solution comprises treating the first bonding surface with dimethylamine borane. In some embodiments, treating the first bonding surface with boric acid comprises treating the first bonding surface with a dimethylamine borane solution having a concentration of dimethylamine borane in a range of 0.5 ppm to 100 ppm. In some embodiments, treating the first bonding surface comprises treating the first bonding surface with a dilute solution containing ammonium and fluoride ions. In some embodiments, treating the first bonding surface comprises treating the first bonding surface with a glass-forming solution. In some embodiments, treating the first bonding surface with the glass-forming solution comprises treating the first bonding surface with a solution that comprises at least one of phosphorus, arsenic, boron, fluorine, carbon, or manganese. In some embodiments, treating the first bonding surface comprises treating the first bonding surface with a solution having a pH in a range of 6 to 10. In some embodiments, the first bonding surface is not rinsed with water after the treating and before the directly bonding. In some embodiments, directly bonding comprises directly bonding the first and second nonconductive field regions at room temperature and, subsequently, annealing the first and second elements to increase a bond strength between the first and second bonding surfaces. In some embodiments, after the annealing, the bond strength between the first and second bonding surface is in a range of 400 mJ/mm2 to 2000 mJ/mm2. In some embodiments, the bond strength between the first and second bonding surface is in a range of 400 mJ/mm2 to 1800 mJ/mm2. In some embodiments, the method includes, after the annealing, further annealing the first and second elements to form electrical connections between the first and second pluralities of contact features. In some embodiments, the bonding method includes slightly etching the second bonding surface of the second element with a liquid etchant to activate the second bonding surface; after the slightly etching the second bonding surface, treating the second bonding surface with a terminating liquid treatment to terminate the second bonding surface with a terminating species. In some embodiments, the bonding method includes polishing the first element to form the first bonding surface. In some embodiments, the bonding method includes, before the slightly etching, providing a protective layer over a bonding surface of a wafer that includes the first element, the bonding surface including the first bonding surface. In some embodiments, the bonding method includes, after providing the protective layer, singulating the wafer into a plurality of elements including the first element. In some embodiments, the bonding method includes removing the protective layer from the first element and cleaning the plurality of elements without exposing the first element to a plasma.

In another embodiment, a bonding method includes: providing a first element having a first bonding surface, the first bonding surface comprising a first nonconductive field region and a first plurality of contact features; providing a second element having a second bonding surface, the second bonding surface comprising a second nonconductive field region and a second plurality of contact features; treating the first bonding surface with a terminating liquid treatment to terminate the first bonding surface with a terminating species; and after the treating, directly bonding the first bonding surface to the second bonding surface such that the first and second nonconductive field regions are directly bonded to one another without an intervening adhesive and such that the first and second pluralities of contact features are directly bonded to one another without an intervening adhesive, wherein the first bonding surface of the first element is not exposed to an oxygen-containing plasma before the direct bonding.

In some embodiments, the first bonding surface of the first element is not exposed to a nitrogen-containing plasma before the direct bonding. In some embodiments, the bonding method of includes, before the treating, slightly etching the first bonding surface of the first element with a liquid etchant to activate the first bonding surface. In some embodiments, slightly etching comprises exposing the first bonding surface to hydrofluoric acid (HF) (e.g., very dilute HF or very dilute buffered hydrofluoric acid). In some embodiments, slightly etching comprises exposing the first bonding surface to very dilute ammonium fluoride, or other very dilute substrate etching chemical species. In some embodiments, the bonding method includes, before the slightly etching, providing a protective layer over a bonding surface of a wafer that includes the first element, the bonding surface including the first bonding surface. In some embodiments, the bonding method includes, after providing the protective layer, singulating the wafer into a plurality of elements including the first element. In some embodiments, the bonding method includes removing the protective layer from the first element and cleaning the plurality of elements without exposing the first element to a plasma. In some embodiments, treating the first bonding surface comprises treating the first bonding surface with tetramethylammonium hydroxide (TMAH). In some embodiments, treating the first bonding surface comprises treating the first bonding surface with a boron-containing solution. In some embodiments, treating the first bonding surface with the boron-containing solution comprises treating the first bonding surface with boric acid. In some embodiments, treating the first bonding surface with the boron-containing solution comprises treating the first bonding surface with dimethylamine borane. In some embodiments, the first bonding surface of the first element is not exposed to a plasma treatment after forming the first bonding surface and before the direct bonding.

In another embodiment, a bonding method includes: providing a first element having a first bonding surface, the first bonding surface comprising a first nonconductive field region and a first plurality of contact features; providing a second element having a second bonding surface, the second bonding surface comprising a second nonconductive field region and a second plurality of contact features; treating the first bonding surface with a terminating liquid treatment to terminate the first bonding surface with a terminating species; and after the treating, directly bonding the first bonding surface to the second bonding surface such that the first and second nonconductive field regions are directly bonded to one another without an intervening adhesive and such that the first and second pluralities of contact features are directly bonded to one another (e.g., at a temperature higher than room temperature) without an intervening adhesive, wherein the first bonding surface of the first element is not exposed to a nitrogen-containing plasma before the direct bonding.

In some embodiments, the first bonding surface of the first element is not exposed to an oxygen-containing plasma before the direct bonding. In some embodiments, the bonding method includes, before the treating, slightly etching the first bonding surface of the first element with a liquid etchant to activate the first bonding surface. In some embodiments, slightly etching comprises exposing the first bonding surface to hydrofluoric acid (HF). In some embodiments, treating the first bonding surface comprises treating the first bonding surface with tetramethylammonium hydroxide (TMAH). In some embodiments, treating the first bonding surface comprises treating the first bonding surface with a boron-containing solution. In some embodiments, treating the first bonding surface with the boron-containing solution comprises treating the first bonding surface with boric acid. In some embodiments, the first bonding surface with the boron-containing solution comprises treating the first bonding surface with dimethylamine borane (or some other very dilute borane bearing solution). In some embodiments, the first bonding surface of the first element is not exposed to a plasma treatment after forming the first bonding surface and before the direct bonding.

In another embodiment, a bonding method includes: polishing a first bonding surface of a first element, the first bonding surface comprising a first nonconductive field region and a first plurality of contact features; after the polishing, cleaning the first bonding surface of the first element without exposing the first bonding surface to a plasma; and after the cleaning, treating the first bonding surface with a terminating liquid treatment to terminate the first bonding surface with a terminating species.

In some embodiments, the bonding method includes polishing a second bonding surface of a second element, the second bonding surface comprising a second nonconductive field region and a second plurality of contact features; and after the treating, directly bonding the first bonding surface to the second bonding surface such that the first and second nonconductive field regions are directly bonded to one another without an intervening adhesive and such that the first and second pluralities of contact features are directly bonded to one another without an intervening adhesive. In some embodiments, cleaning the first bonding surface comprises slightly etching the first bonding surface. In some embodiments, slightly etching comprises exposing the first bonding surface to hydrofluoric acid (HF). In some embodiments, treating the first bonding surface comprises treating the first bonding surface with at least one of tetramethylammonium hydroxide (TMAH), boric acid, and dimethylamine borane. In some embodiments, the first bonding surface of the first element is not exposed to a plasma treatment after polishing the first bonding surface and before the direct bonding.

In another embodiment, a bonding method includes: providing a protective layer to a bonding surface of a substrate; singulating the substrate and protective layer into a plurality of dies; removing the protective layer to expose a bonding surface of each die, the bonding surface of each die having a plurality of contact pads at least partially embedded in a nonconductive field region; and preparing the bonding surface of one or more dies for direct bonding without exposing the bonding surface of the one or more dies to a plasma.

In some embodiments, the die comprises a semiconductor integrated device die having active circuitry.

In another embodiment, a bonding method includes: singulating a substrate into a plurality of dies; and preparing a bonding surface of one or more dies for bonding without exposing the bonding surface of the dies to a plasma, the bonding surface of the one or more dies having a plurality of contact pads at least partially embedded in a nonconductive field region.

In some embodiments, the bonding method includes coating the bonding surface of the one or more dies with a protective layer before the singulating and removing the protective layer after the singulating and before the preparing for bonding. In some embodiments, the protective layer comprises of a photosensitive material.

In another embodiment, a device includes: a singulated substrate having a bonding surface formed without exposing the bonding surface to a plasma, wherein the bonding surface includes a plurality of contact pads at least partially embedded in a nonconductive field region.

6

In some embodiments, the bonding surface comprises at least one of phosphorus, arsenic, boron, fluorine, manganese nitrogen, carbon. In some embodiments, a concentration of at least one of boron and carbon at the bonding surface is higher than a nominal concentration at a back-end-of-line (BEOL) interface by at least 5%. In some embodiments, a concentration of boron at the bonding surface is greater than $1 \times 10^{13}$ atoms/cm2. In some embodiments, the concentration of boron at the bonding surface is greater than $2 \times 10^{13}$ atoms/cm2.

In another embodiment, a bonded device includes: a first substrate having a first bonding surface including a plurality of contact pads at least partially embedded in a first nonconductive field region; and a second substrate having a second bonding surface directly bonded to the first bonding surface of the first substrate, wherein a bonding interface between the first substrate and the second substrate comprises at least one of phosphorus, arsenic, boron, fluorine, manganese nitrogen, and carbon, and wherein a concentration of at least one of boron and carbon along the bonding interface is higher than the nominal concentration at a BEOL interface by at least 5%.

In some embodiments, the second substrate comprises a plurality of contact pads at least partially embedded in a second nonconductive field region. In some embodiments, the concentration of boron along the bonding interface is greater than $1 \times 10^{13}$ atoms/cm2. In some embodiments, the concentration of boron along the bonding interface is greater than $2 \times 10^{13}$ atoms/cm2

BRIEF DESCRIPTION OF THE DRAWINGS

FIGS. 1A and 1B are flow diagrams of example wafer-to-wafer direct bonding processes.

FIGS. 2A and 2B are flow diagrams of example die-to-wafer direct bonding processes.

FIGS. 5A and 5B are flow diagrams of die-to-wafer direct bonding processes according to some embodiments.

Figure 2B:
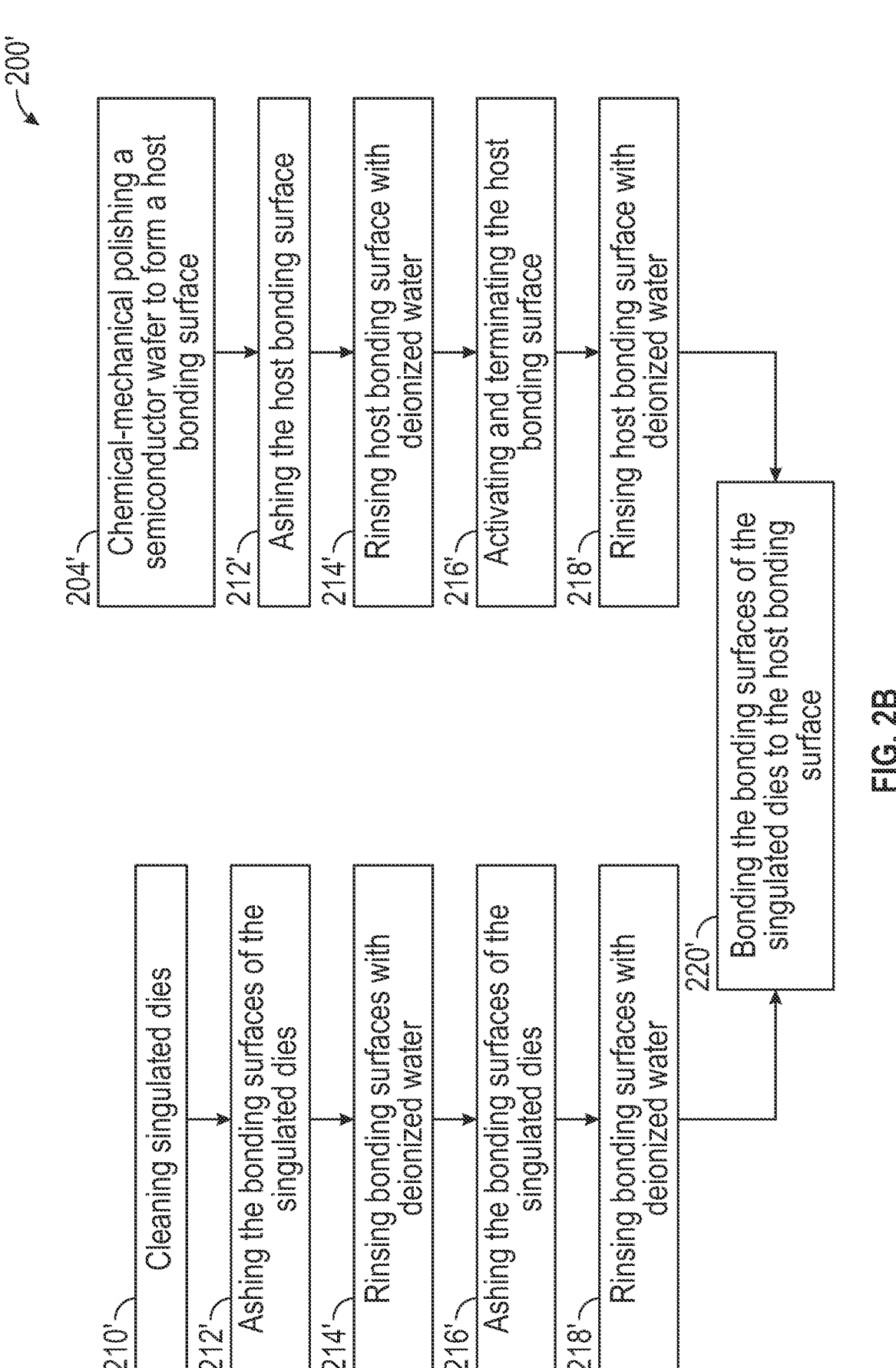

DETAILED DESCRIPTION OF THE
PREFERRED EMBODIMENT

Various embodiments disclosed herein relate to directly bonded structures in which two or more elements can be directly bonded to one another without an intervening adhesive. A bonded structure comprises two elements that can be directly bonded to one another without an intervening adhesive. Two or more semiconductor elements (such as integrated device dies, wafers, etc.) may be stacked on or bonded to one another to form the bonded structure. Conductive features (e.g., contact pads, exposed ends of vias (e.g., TSVs), or a through substrate electrodes) of a first element may be electrically connected to corresponding conductive features of a second element. Any suitable number of elements can be stacked in the bonded structure. For example, a third element can be stacked on the second element, a fourth element can be stacked on the third element, and so forth. Additionally or alternatively, one or more additional elements (not shown) can be stacked laterally adjacent one another along the first element. In some embodiments, the laterally stacked additional element may be smaller than the second element. In some embodiments, the laterally stacked additional element may be two times smaller than the second element.

In some embodiments, the elements are directly bonded to one another without an adhesive. In various embodiments, a non-conductive field region that includes a non-conductive or dielectric material can serve as a first bonding layer of the first element which can be directly bonded to a corresponding non-conductive field region that includes a non-conductive or dielectric material serving as a second bonding layer of the second element without an adhesive. The non-conductive bonding layers can be disposed on respective front sides of device portions, such as a semiconductor (e.g., silicon) portion of the elements. Active devices and/or circuitry can be patterned and/or otherwise disposed in or on the device portions. Active devices and/or circuitry can be disposed at or near the front sides of the device portions, and/or at or near opposite backsides of the device portions. The non-conductive material can be referred to as a non-conductive bonding region or bonding layer of the first element. In some embodiments, the non-conductive bonding layer of the first element can be directly bonded to the corresponding non-conductive bonding layer of the second element using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers can comprise a non-conductive material such as a dielectric material, such as silicon oxide, or an undoped semiconductor material, such as undoped silicon. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SICOH dielectrics, silicon carbonitride or diamond-like carbon or a material comprising of a diamond surface. Such carbon-containing ceramic materials can be considered inorganic, despite the inclusion of carbon. In some embodiments, the dielectric materials may not comprise polymer materials, such as epoxy, resin or molding materials.

In various embodiments, direct hybrid bonds can be formed without an intervening adhesive. For example, non-conductive bonding surfaces can be polished to a high degree of smoothness. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surfaces, and the termination process can provide additional chemical species at the bonding surfaces that improves the bonding energy during direct bonding. In some embodiments, the activation and termination are provided in the same step, e.g., a plasma to activate and terminate the surfaces. In other embodiments, the bonding surfaces can be terminated in a separate treatment to provide the additional species for direct bonding. In various embodiments, the terminating species can comprise nitrogen. For example, in some embodiments, the terminating species can comprise a nitrogen-bearing fluid or liquid. In some embodiments, the bonding surface(s) can be exposed to a nitrogen-containing plasma. Further, in some embodiments, the bonding surfaces can be exposed to fluorine. For example, there may be one or multiple fluorine peaks at or near a bonding interface between the first and second elements. Thus, in the directly bonded structure, the bonding interface between two non-conductive materials (e.g., the bonding layers) can comprise a very smooth interface with higher nitrogen content and/or fluorine peaks at the bonding interface. Additional examples of activation and/or termination treatments may be found throughout U.S. Pat. Nos. 9,564,414; 9,391,143; and 10,434,749, the entire contents of each of which are incorporated by reference herein in their entirety and for all purposes.

In various embodiments, conductive features of the first element can also be directly bonded to corresponding conductive features of the second element. For example, a hybrid bonding technique can be used to provide conductor-to-conductor direct bonds along the bond interface that includes covalently direct bonded non-conductive-to-non-conductive (e.g., dielectric-to-dielectric) surfaces, prepared as described above. In various embodiments, the conductor-to-conductor (e.g., conductive feature to conductive feature) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes.

For example, non-conductive (e.g., dielectric) bonding surfaces (for example, inorganic dielectric surfaces) can be prepared and directly bonded to one another without an intervening adhesive as explained above. Conductive contact features (e.g., conductive features which may be at least partially surrounded by non-conductive dielectric field regions within the bonding layers) may also directly bond to one another without an intervening adhesive. In various embodiments, the conductive features can comprise discrete pads at least partially embedded in the non-conductive field regions. In some embodiments, the conductive contact features can comprise exposed contact surfaces of through substrate vias (TSVs). In some embodiments, the respective conductive features can be recessed below exterior (e.g., upper) surfaces (non-conductive bonding surfaces) of the dielectric field region or non-conductive bonding layers, for example, recessed by less than 30 nm, less than 20 nm, less than 15 nm, or less than 10 nm, for example, recessed in a range of 2 nm to 20 nm, or in a range of 4 nm to 10 nm. In various embodiments, prior to direct bonding, the recesses in the opposing elements can be sized such that the total gap between opposing contact pads is less than 15 nm, or less than 10 nm. The non-conductive bonding layers can be directly bonded to one another without an adhesive at room temperature in some embodiments and, subsequently, the bonded structure can be annealed. Upon annealing, the conductive features can expand and contact one another to form a metal-to-metal direct bond. Beneficially, the use of Direct Bond Interconnect, or DBI®, techniques commercially available from Adeia of San Jose, CA, can enable high density of conductive features to be connected across the direct bond interface (e.g., small or fine pitches for regular arrays). In some embodiments, the pitch of the conductive features, such as conductive traces embedded in the bonding surface of one of the bonded elements, may be less than 40 microns or less than 10 microns or even less than 2 microns. For some applications, the ratio of the pitch of the conductive features to one of the dimensions (e.g., a diameter) of the bonding pad is less than 5, or less than 3 and sometimes desirably less than 2. In other applications, the width of the conductive traces embedded in the bonding surface of one of the bonded elements may range between 0.3 to 20 microns, e.g., in a range of 0.3 to 3 microns. In various embodiments, the conductive features and/or traces can comprise copper, although other metals may be suitable.

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer). The embodiments disclosed herein can accordingly apply to wafer-to-wafer, die-to-die, or die-to-wafer bonding processes. In wafer-to-wafer (W2W) processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the singulation process (e.g., saw markings if a saw singulation process is used).

As explained herein, the first and second elements can be directly bonded to one another without an adhesive, which is different from a deposition process. In one application, a width of the first element in the bonded structure is similar to a width of the second element. In some other embodiments, a width of the first element in the bonded structure is different from a width of the second element. Similarly, the width or area of the larger element in the bonded structure may be at least 10% larger than the width or area of the smaller element. The first and second elements can accordingly comprise non-deposited elements. Further, directly bonded structures, unlike deposited layers, can include a defect region along the bond interface in which nanometer-scale voids (nanovoids) are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace some of the OH groups of a hydrolyzed (OH-terminated) surface with N—H moieties or species, yielding a nitrogen-terminated surface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the contact pads can be joined such that copper grains grow into each other across the bond interface. In some embodiments, the copper grains grow into each other across the bond interface after annealing the bonded structures or substrates, e.g., at temperatures between 50 and 400° C. or at temperatures between 80 and 300 C. In some embodiments, the copper can have grains oriented along the 111 crystal plane for improved copper diffusion across the bond interface. The bond interface can extend substantially entirely to at least a portion of the bonded conductive features, such that there is substantially no gap between the non-conductive bonding layers at or near the bonded conductive features. In some embodiments, a barrier layer may be provided under the conductive features (e.g., which may include copper). In other embodiments, however, there may be no barrier layer under the conductive features, for example, as described in U.S. Pat. No. 11,195,748, which is incorporated by reference herein in its entirety and for all purposes.

Beneficially, the use of the hybrid bonding techniques described herein can enable extremely fine pitch between adjacent contact pads, and/or small pad sizes. For example, in various embodiments, the pitch p (i.e., the distance from edge-to-edge or center-to-center between adjacent conductive features can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

FIGS. 1A, 1B, 2A and 2B are flow diagrams illustrating conventional direct bonding techniques, where FIGS. 1A and 1B illustrate conventional wafer-to-wafer (W2W) direct bonding processes while FIGS. 2A and 2B illustrate conventional die-to-wafer (D2W) direct bonding processes.

FIG. 1A depicts a first wafer-to-wafer direct bonding process 100. At step 102, first and second semiconductor wafers are provided, where the first semiconductor wafer has a first bonding surface and the second semiconductor wafer has a second bonding surface.

At step 104, the first and second bonding surfaces are polished. In some embodiments, the bonding surfaces are polished using a chemical-mechanical polishing (CMP) technique in order to planarize the surface of the wafers. The CMP process may also help to clean off some particles remaining on the planarized surface.

After polishing, debris, such as organic or inorganic particles, may be present on the bonding surfaces. If such debris remains on the bonding surfaces throughout the bonding process, the debris can create voids in the bonds, which can reduce the strength of the direct bonds. Accordingly, at step 106, the first and second bonding surfaces can be cleaned using respective ashing processes, in which the first and second wafers are exposed to oxygen plasma to remove residual organic materials on the bonding surface. In some embodiments, a megasonic cleaning process may also be used to remove additional particulates from the substrate.

At step 108, in some embodiments, the first and second bonding surfaces can be rinsed with deionized water (DI) to remove any additional debris. In alternative embodiments, however, rinsing the first and second bonding surfaces with DI to remove additional debris may not be performed, or may be performed to only one of the first and second bonding surfaces. Accordingly, in some alternative embodiments, only one of the bonding surfaces (e.g., the first bonding surface) is rinsed with DI while the other bonding surface (e.g., the second bonding surface) is not rinsed with DI. In still other embodiments, step 108 is not performed at all such that neither of the bonding surfaces is rinsed with DI.

At step 110, the first and second bonding surfaces are activated and terminated by exposing the bonding surfaces to a plasma, such as a nitrogen plasma. The nitrogen plasma can bombard the bonding surfaces so as to break bonds at the bonding surface and to terminate the surface with nitrogen, which can increase the bond energy during bonding. In the illustrated embodiment, both the first and second bonding surfaces are exposed to the plasma to activate the surfaces. In other embodiments, however, only one of the bonding surfaces may be exposed to the plasma while the other surface is not exposed. In these embodiments, the plasma only activates one of the bonding surfaces while the other bonding surface is not activated or terminated.

At step 112, the bonding surfaces can be rinsed with DI water and subsequently thoroughly dried.

At step 114, the first and second bonding surfaces can be directly bonded to one another at room temperature without an intervening adhesive, thereby causing the first and second semiconductor wafers to be directly bonded to each other. During the direct bonding process, the first and second semiconductor wafers can be aligned such nonconductive regions on the first bonding surface are aligned with nonconductive regions on the second bonding and conductive contact pads on the first bonding surface are aligned with and disposed opposite from corresponding conductive contacts on the second bonding surface. In some embodiments, the direct bond can comprise a direct nonconductive bond in which nonconductive regions on the first bonding surface are directly bonded to corresponding nonconductive regions on the second bonding surface. In other embodiments, the direct bond can comprise a hybrid direct bond in which nonconductive regions on the first bonding surface are directly bonded to corresponding nonconductive regions on the second bonding surface and conductive contacts on the first bonding surface are directly bonded to corresponding conductive contacts on the second bonding surface. In some embodiments, the assembled or bonded structure can be annealed at a higher temperature to form metallurgical bonds between the opposing conductive contacts and to further increase the bond energy or bond strength between the bonded surfaces as explained herein.

FIG. 1B depicts a second wafer-to-wafer direct bonding process 100'. At step 104', first and semiconductor wafers are polished using a CMP technique to planarize the surface of the wafers. At step 106', the first and second bonding surfaces are ashed. As described above in connection with step 106 of FIG. 1A, the ashing process is used to clean the bonding surfaces. In some embodiments, the first and second bonding surfaces are ashed by exposing the surfaces to a plasma, such as an oxygen plasma. At step 108', the first and second bonding surfaces are rinsed with deionized water to remove any additional debris from the bonding surfaces. At step 110' the bonding surfaces are activated. In some embodiments, the bonding surfaces are activated by exposing the surfaces to a plasma, as described above in connection with step 110 of FIG. 1A. At step 112', the first and second bonding surfaces are rinsed with deionized water and then thoroughly dried. At step 114', the first and second bonding surfaces are directly bonded together. In some embodiments, the first and second bonding surfaces are directly bonded together without an intervening adhesive and then annealed, as described above in connection with step 114 of FIG. 1A.

FIG. 2A depicts a conventional D2W direct bonding process 200, which may be generally similar to the W2W process shown in FIGS. 1A and 1B. At step 202, as explained above, first and second semiconductor wafers are provided, where the first semiconductor wafer has a first bonding surface and the semiconductor wafer has a second bonding surface.

At step 204, the first and second bonding surfaces are polished. In some embodiments, the bonding surfaces are polished using a CMP process.

At step 206, to protect the first bonding surface during singulation of the first semiconductor wafer, a protective layer (such as a photosensitive resist layer, which can comprise an organic layer) is provided over the first bonding surface. The wafer with the protected surface can be supported on a dicing sheet, with the protective layer facing up for the singulation operation.

At step 208, the first semiconductor wafer is singulated into a plurality of integrated device dies, with the protective layer protecting the bonding surface during singulation. Any suitable singulation process may be used, such as sawing, laser singulation, etching, etc.

At step 210, the protective layer is stripped from at least one of the singulated dies to expose the first bonding surface. In some embodiments, a suitable solvent is used to remove the protective layer. The suitable solvent may include a resist stripping solvent. In some embodiments, the now-exposed first bonding surface of the singulated die may also be rinsed with DI and dried.

At step 212, the first bonding surface of the singulated integrated device die and the second bonding surface of the second semiconductor wafer are cleaned using an ashing process. For example, the first and second bonding surfaces can be exposed to oxygen plasma to remove undesirable organic debris from the surfaces.

At step 214, in some embodiments, the first and second bonding surfaces may be rinsed with DI and dried to remove any remaining debris or organic material.

At step 216, the first and second bonding surfaces are activated by exposing the bonding surface to a plasma, such as a nitrogen-containing plasma.

At step 218, in some embodiments, the first and second bonding surfaces are then rinsed with DI water and subsequently thoroughly dried.

At step 220, the first and second bonding surfaces are directly bonded to one another at room temperature without an intervening adhesive, thereby causing the singulated integrated device die to be directly bonded to each other. In some embodiments, the direct bond can comprise a direct nonconductive bond in which nonconductive regions on the first bonding surface are directly bonded to corresponding nonconductive regions on the second bonding surface. In other embodiments, the direct bond can comprise a hybrid direct bond in which nonconductive regions on the first bonding surface are directly bonded to corresponding nonconductive regions on the second bonding surface and conductive contacts on the first bonding surface are directly bonded to corresponding conductive contacts on the second bonding surface. To cause the conductive contact pads on the first bonding surface to bond to the corresponding contact pads on the second bonding surface, the bonded structure can be annealed at a higher temperature after the nonconductive regions are bonded together, which result in the formation of a metallurgical joint between the opposing conductive contacts on the first and second surfaces. Annealing the bonded structure can also increase the bond energy or bond strength between the nonconductive regions on the bonded first and second bonding surfaces.

FIG. 2B depicts a second die-to-wafer direct bonding process 200'. At step 210' singulated dies are cleaned. At step 204', a semiconductor wafer is polished using a CMP technique to form a host bonding surface. At step 212' the bonding surfaces of the singulated dies and the host bonding surface are ashed. As described above in connection with step 106 of FIG. 1A, the ashing process is used to clean the bonding surfaces. In some embodiments, the bonding surfaces of the singulated dies and the host bonding surface are ashed by exposing the surfaces to a plasma, such as an oxygen plasma. At step 214' the bonding surfaces of the singulated dies and the host bonding surface are rinsed with deionized water. At step 216', the bonding surfaces of the singulated dies are ashed while the host bonding surface are activated, as described above in connection with step 110 of FIG. 1A. At step 218', the bonding surfaces of the singulated dies and the host bonding surface are rinsed with deionized water. At step 220', the bonding surfaces of the singulated dies are directly bonded to the host bonding surface. In some embodiments, the bonding surfaces of the singulated dies are bonded to the host bonding surface without an intervening adhesive and then annealed at a higher temperature, as described above in connection step 114 of FIG. 1A.

Various embodiments disclosed herein can beneficially obviate the use of a plasma for direct bonding processes. The use of one or multiple plasma exposure or treatment steps (e.g., an oxygen ashing plasma and/or an activating nitrogen and/or oxygen plasma) increases the manufacturing costs of direct bonding processes. Moreover, for elements singulated on a dicing frame, excessive plasma bombardment of the bonding surface of the semiconductor elements may increase the surface roughness by excessively oxidizing the conductive contacts at the bonding surfaces, which can cause the contacts to protrude over the bonding surface. Accordingly, excessive plasma bombardment can reduce the bonding strength between the bonding surfaces or even prevent the surfaces from bonding together. Additionally, plasma bombardment of the exposed surfaces of the dicing tape surface may transfer water insoluble organic residues from the dicing tape to the bonding surface of the die. The bonding surface of dies with organic dicing residues tend to exhibit low bonding energies when bonded to the prepared surface of a host substrate. In addition, the organic residues from the nitrogen activation step may contaminate the bonding surfaces of the dies with water insoluble organic residues and can also contaminate the vacuum chamber of the plasma tool. This tool contamination can result in contamination of all bonding surfaces processed in the chamber. The plasma chamber can be decontaminated by an extensive oxygen chamber ashing step, followed by wiping the interior of the plasma chamber. The plasma chamber may be requalified by a designated method. Cleaning and requalifying the plasma chamber results in higher operating and process ownership costs.

Also, some low dielectric constant materials and some spin-on dielectric materials (for example Silk™ from Dow Chemicals), may be degraded by direct exposure to a very reactive plasma, such as oxygen or nitrogen plasma. The exposure may render the surface of the dielectric highly hydrophilic and, in some instances, may degrade and increase the dielectric constant K of the material.

Accordingly, due to the unwanted cost associated with device bonding surface contamination and chamber requalification when a dicing frame is exposed to nitrogen plasma, there remains a continuing demand for improved direct bonding processes that do not use a plasma process (e.g., in which the bonding processes do not utilize any plasma processes for one or more of the elements to be bonded).

Figure 3:
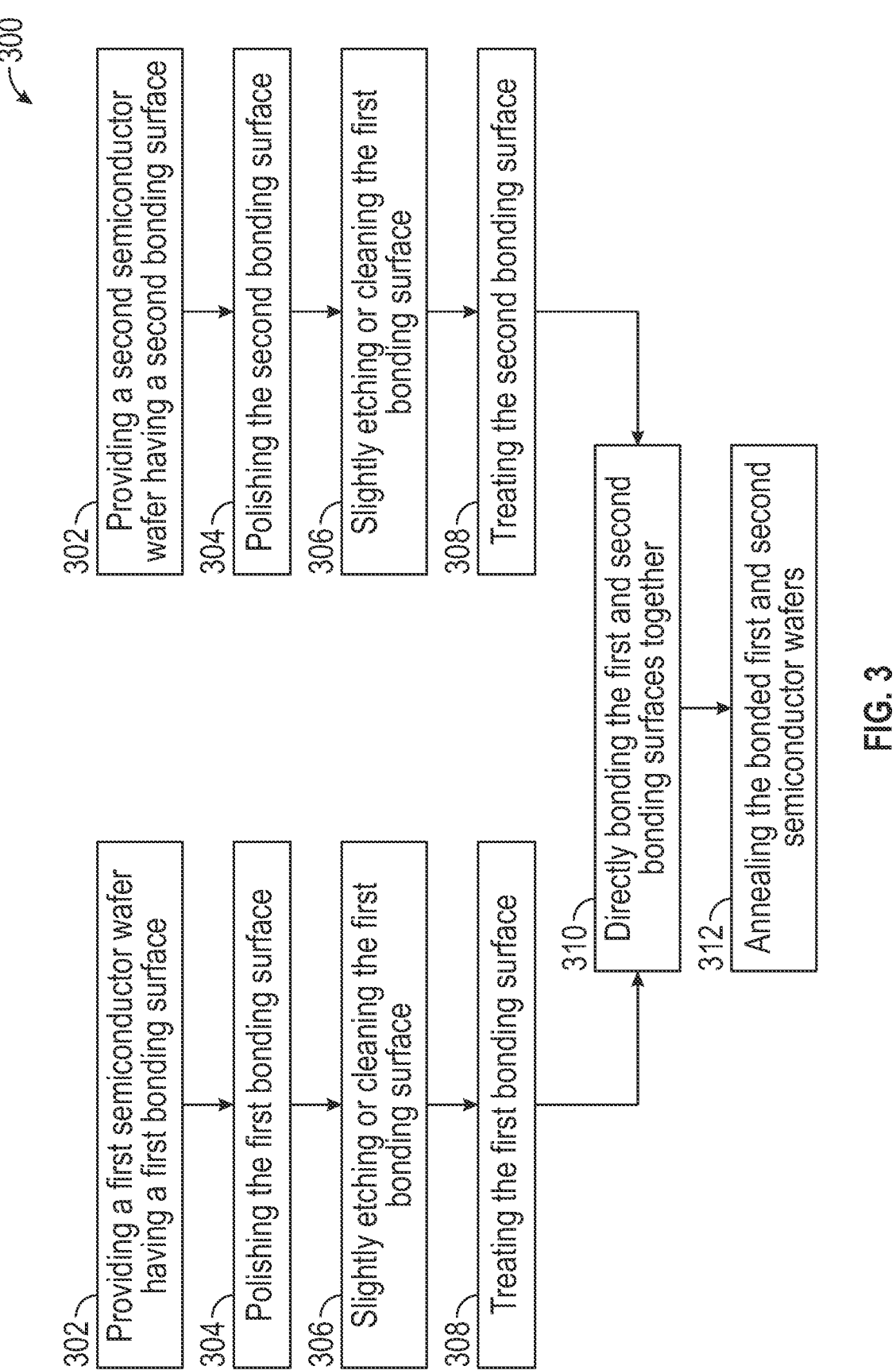
FIG. 3 is a flow diagram of a wafer-to-wafer direct bonding process according to some embodiments.
Figure 4A:
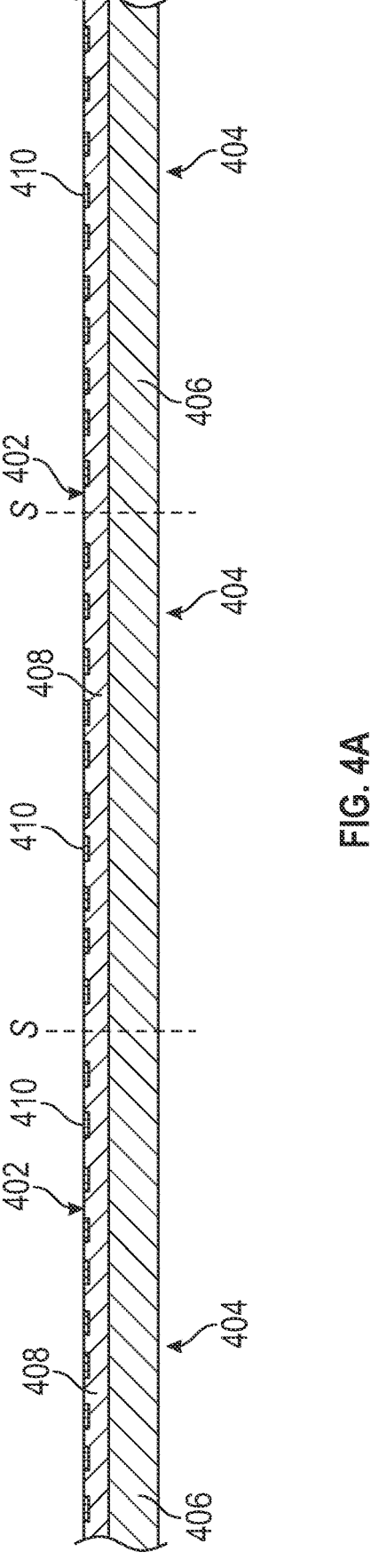
FIGS. 4A-4E are schematic side sectional views showing various steps of the wafer-to-wafer direct bonding process shown in FIG. 3.

FIG. 3 is a flow diagram of a wafer-to-wafer (W2W) direct bonding process 300, according to various embodiments. FIGS. 4A-4E are schematic side sectional views showing various steps of the W2W process 300 of FIG. 3. As shown in FIG. 4A, at step 302, first and second wafers 400 are provided. Each wafer 400 includes a plurality of elements 404 formed therein and a plurality of saw streets S such that, when singulated along the saw streets S, the wafer 400 is separated into a plurality of singulated elements 404 or dies. Each wafer 400 includes a bonding surface 402. Each of the plurality of elements 404 comprises a base portion 406 and a nonconductive field or bonding region 408 over the base portion 406. In some embodiments, the nonconductive field region 408 is formed from a dielectric material and the base portion 406 is formed from a semiconductor material. In some embodiments, the nonconductive field region 408 comprises a nonconductive bonding layer (e.g., a dielectric bonding layer) provided over a semiconductor base portion. The base portion of one or both the first and second elements can comprise active circuitry (e.g., transistors) therein. Each of the elements 400 includes one or more conductive contact features 410 within the nonconductive field region 408. In some embodiments, the contact features 410 are at least partially embedded in the nonconductive field region 408 such that the contact features 410 are surrounded by a dielectric material (such as silicon oxide). The conductive features can comprise contact pads in various embodiments. In other embodiments, the conductive features can comprise exposed ends of conductive vias or any other suitable contact structure configured to electrically connect and bond to another device. Although not shown due to scale, as explained above, the conductive contact features can be recessed below the bonding surfaces prior to direct bonding.

In some embodiments, the base portions 406 of one or more of the elements 404 comprises active circuitry (e.g., transistors) therein and the active circuitry can be coupled to the contact features 410 in the nonconductive field region 408, for example, by conductive traces formed in the field region 408. In some embodiments, the base portions 406 for all the elements 404 in one of the wafers 400 can comprise active circuitry therein. In other embodiments, however, the base portions 406 for the elements 404 in a given wafer 404 do not include active circuitry. In these embodiments, the elements 404 having base portions 406 that do not comprise active circuitry can be bonded to elements 404 having base portions 406 that do comprise active circuitry therein. In other embodiments, the elements 404 having base portions 406 comprising active circuitry therein can be bonded to other elements 404 having base portions comprising active circuitry therein.

At step 304, the bonding surfaces 402 of the first and second wafers 400 can be planarized and polished by a chemical-mechanical polishing (CMP) process.

Figures 4B, 4C:
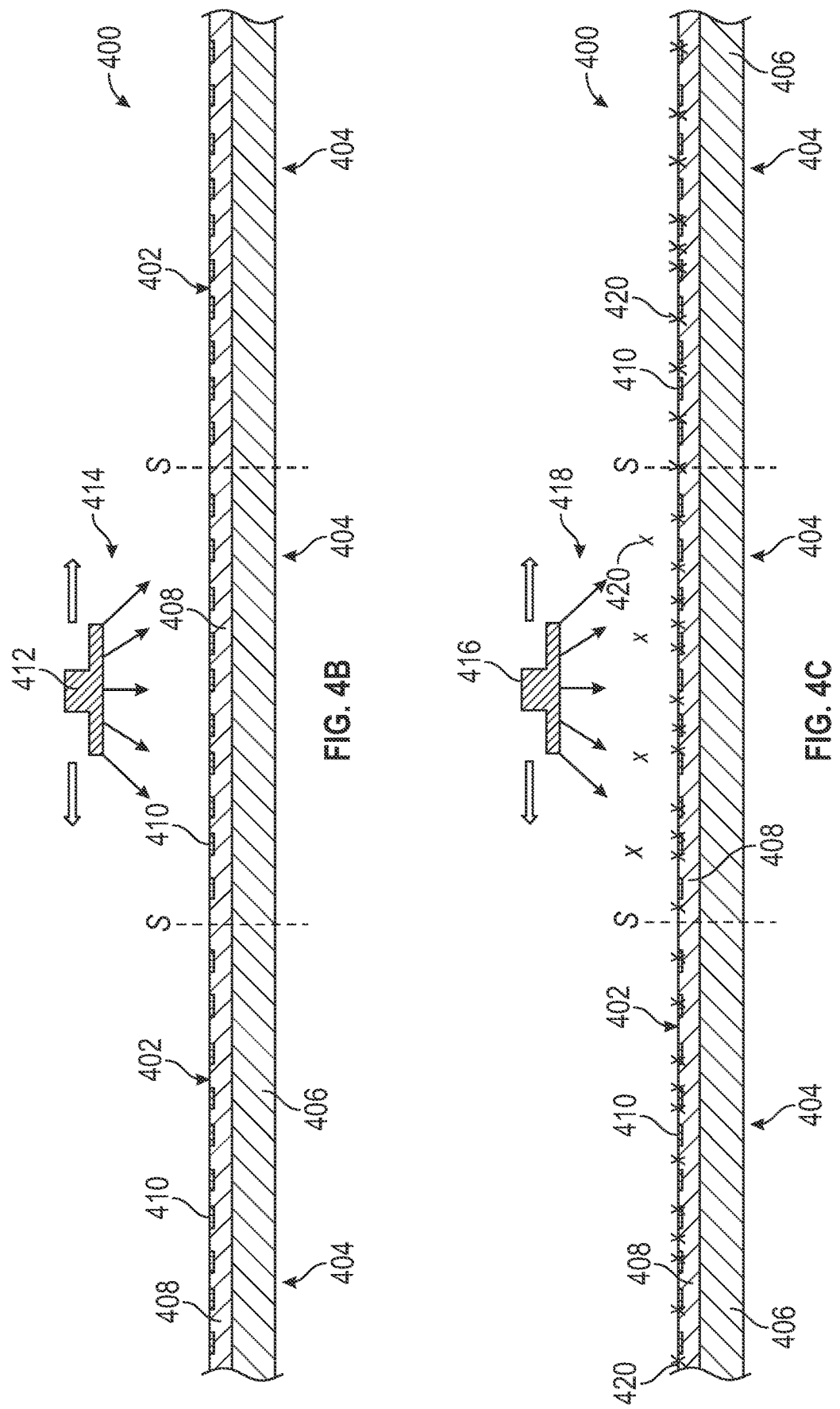

As shown in FIG. 4B, at step 306, the bonding surfaces 402 of one or both of the first and second wafers 400 can be cleaned or very slightly etched with a liquid or vapor cleaning chemical 414. In some embodiments, the cleaning chemical 414 is dispersed over the bonding surface 402 with a liquid dispersion device 412. The cleaning chemical 414 can be formulated to remove debris from the bonding surface 402 of the nonconductive field region 408 and, depending on the nature of the dielectric material that forms the nonconductive field region 408, may slightly etch the bonding surface 402 and the contact features 410. In some
embodiments, the cleaning chemical 414 is configured to
etch the bonding surface 402 without degrading the smooth-
ness of the bonding surface 402. For example, the cleaning
chemical 414 may remove less than 10 nm from the bonding
surface 402, less than 5 nm from the bonding surface 402,
or less than 0.5 nm from the bonding surface 402. In various
embodiments, for example, the cleaning chemical 414 com-
prises a very dilute buffered hydrofluoric acid (BHF) solu-
tion having a concentration of less than 1%, e.g., in a range
of 10 ppm to 1000 ppm or in a range of 50 ppm to 500 ppm.

The cleaning chemical 414 may comprise one or more
suitable surfactants to improve uniformity of cleaning across
the bonding surface 402. In some embodiment, the activity
of the cleaning chemical 414 may be moderated by the
incorporated alcohols, hydroxyalcohols (e.g., alcohols con-
taining hydroxyl functional groups or radicals), etc. Benefi-
cially, using cleaning chemical 414 to clean the bonding
surface 402 can obviate the use of a plasma cleaning step
(e.g., an ashing step) shown in FIG. 1, such that an oxygen-
containing plasma is not used to clean the wafer(s) 400.

As shown in FIG. 4B, a liquid dispersion device 412 can
be used to disperse the cleaning chemical 414 over the
element 404. For example, the liquid dispersion device 412
can be configured to spray the cleaning chemical 414 over
the bonding surface 402 by activating a fan nozzle or a
non-fan nozzle. However, in some embodiments a liquid
dispersion device 412 to apply the cleaning chemical 414 to
the bonding surface may not be utilized and the cleaning
chemical 414 can be applied to the bonding surface 402
using other techniques. For example, in some embodiments,
the cleaning chemical 414 can be applied to the bonding
surface 402 by at least partially immersing the elements 404
in the cleaning chemical 414 or by dipping the wafer 400 in
the cleaning chemical 414. In some embodiments, the bond-
ing surface 402 may be cleaned with the assistance of a
megasonic cleaning device.

In some embodiments, more than one cleaning solution is
used at step 306 to clean the bonding surfaces 402. For
example, in some embodiments, water can be used in
conjunction with the cleaning chemical 414 to clean the
bonding surfaces 402. Specifically, the bonding surfaces 402
can be rinsed with DI to remove unwanted debris from the
bonding surface. After rinsing the bonding surfaces 402 with
DI, the bonding surfaces 402 may then be dried before the
cleaning chemical 414 is applied to the bonding surface 402
to prepare the bonding surface 402 for the chemical treat-
ment step. In some embodiments, the step 306 may incor-
porate a DI rinse and drying the substrate after the DI rinsing
step. In other embodiments, there may be no DI rinse
between steps 304 and 306. In still other embodiments, very
slight etching can be omitted, particularly if a prior cleaning
step (e.g., developing solution) leaves a suitable surface for
subsequent processing.

In some embodiments, the wafers 400 can be bonded after
the cleaning and drying step of step 306. After the bonding
operation at room temperature, the bonded wafers 400 may
be annealed at a higher temperature, e.g., in a range of 80°
C. to 400° C. for a time ranging between 15 minutes to 60
minutes, depending on the process recipe. In general, the
bond energy of the interface of the bonded wafers 400 or
substrate may be less than 1000 mJ/mm², and may not be
adequate for a subsequent operation, for example, the grind-
ing of the back surface of wafer to thin the wafer for
subsequent operations.

As shown in FIG. 4C, and at step 308 of FIG. 3, the
bonding surface 402 of one or both wafers 400 is treated with a terminating fluid treatment 418 dispersed by a dis-
persion device 416. The terminating fluid treatment is per-
formed to terminate the bonding surface 402 of the wafer(s)
400 with a terminating species 420, which can enhance
bonding between the two wafers 400. The terminating fluid
treatment 418 can comprise liquid or vapor. Beneficially, the
use of a fluid (liquid or vapor) terminating species 420 can
obviate the use of a plasma in the direct bonding process. For
example, in the disclosed embodiment, no nitrogen plasma
process may be used before direct bonding. In various
embodiments, the bonding surface 402 of one or both wafers
400 may not be exposed to any plasma before direct bond-
ing.

In various embodiments, terminating liquid treatment 418
can comprise a chemical species with low alkalinity and low
acidity. For example, the terminating fluid treatment 418 can
comprise a solution having a pH in a range of 5 to 11, or in
a range of 6 to 10. In some embodiments, the pH is less than
about 9.

In some embodiments, the terminating fluid treatment
(e.g., terminating treatment) leaves residues of nitrogen,
boron, phosphorus, or their various combinations on the
bonding surface 402 (and at the bonding interface of the
bonded structure), which can increase covalent bond
strength after direct bonding. In some embodiments, the
terminating fluid treatment 418 can comprise ammonium
hydroxide (NH₄OH). For example, in some embodiments,
the terminating fluid treatment 418 comprises tetramethyl-
ammonium hydroxide (TMAH). The TMAH solution can
have a concentration of TMAH of less than 100 ppm, e.g.,
in a range of 0.5 ppm to 100 ppm, in a range of 1 ppm to 100
ppm, or 5 ppm to 100 ppm in DI water. Beneficially, the
TMAH in the liquid treatment 418 can terminate the bond-
ing surface 402 sufficiently for direct bonding, while avoid-
ing excessive damage of the conductive contact features
410. Other analogues of TMAH may be applied for the
terminating treatment 418, including, for example, tert-
Butylammonium hydroxide, tetraethylammonium hydrox-
ide, ethyltrimethylammonium hydroxide and the like. In
some embodiments, the carrier or solvent for the terminating
compound 420 may comprise lower molecular weight sol-
vents, for example, alcohols (methyl alcohol, ethyl alcohol)
or ketones. In some embodiments, the carrier for the termi-
nating compound 420 may be an inert gas, for example
nitrogen, argon or helium. For example, an Atomic Layer
Deposition (ALD) method may be used to form the termi-
nating treatment. In various embodiments, for example, the
conductive contact features 410 comprise copper pads or
vias. In contrast to ammonium hydroxide, very low concen-
tration TMAH will not excessively etch the copper contact
features, which would alter the pre-bonding pad recess and,
accordingly, increase the temperature required for the metal-
lic conductive contact pads 410 on the opposing bonding
surfaces to bond together. TMAH or other, lower alkalinity
chemicals can beneficially reduce the degree of etching of
the copper features, which can improve the yield of the
direct metallic bonds. In various embodiments, the element
(s) may not be exposed to an ozone treatment.

In other embodiments, the terminating fluid treatment 418
can comprise a boron-containing solution. For example, in
some embodiments, the terminating fluid treatment 418 can
comprise boric acid. The boric acid can comprise a boric
acid solution having a concentration of boric acid in a range
of 0.5 ppm to 200 ppm. Other sources of boron containing
solutions or gases (for example, boric anhydride, boraneammonia, borane trimethyl complex, tetrahydroxydiboron, etc.) may be applied for terminal treatment on the bonding surface 402 of the substrate.

In some embodiments, the terminating fluid treatment 418 includes both boron and nitrogen. For example, the terminating fluid treatment 418 can comprise a solution of dimethylamine borane (DMAB). The DMAB solution can have a concentration of dimethylamine borane in a range of 0.5 ppm to 500 ppm, for example, in a range of 0.5 ppm to 200 ppm.

In other embodiments, the terminating fluid treatment 418 can comprise a fluoride containing solution. For example, in some embodiments, the terminating fluid treatment 418 can comprise a dilute solution of ammonium fluoride, ammonium bifluoride, a combination of ammonium fluoride and ammonium bifluoride, or another ammonium-fluoride complexes. The terminating solution can comprise, for example, an ammonium-fluoride solution having a concentration in a range of 0.5 ppm to 200 ppm. In some embodiments, ammonium ions and fluoride ions from other sources (e.g., ammonium hydrogen fluoride) may be used to terminate the bonding surface 402.

In some embodiments, the terminating fluid treatment 418 comprises a glass-forming solution that can aid in strengthening direct bonds. The glass-forming solution can comprise a relatively low molecular weight compound including elements from one or more of Groups III and/or V. The glass-forming solution can have a molecular weight of less than 600 Daltons (Da), less than 500 Da, less than 200 Da, or less than 150 Da. The glass-forming solution can have a molecular weight in a range of 5 Da to 150 Da. For example, the glass-forming solution can comprise at least one of phosphorus, arsenic, boron, fluorine, carbon, and manganese (for example, less than 1000 ppm of these elements). The amounts of boron, nitrogen and carbon can exceed the nominal threshold concentration found between the interface of two dielectric layers beneath the bonding surface. The glass-forming species listed above can originate from residues on the surface from the chemical treatment. The concentration of the glass forming element at the bonding surface can be higher than the concentration of glass forming elements found at the interface of two coated dielectric layers beneath the bonding surface of the back-end-of-line (BEOL) layers. In some embodiment, the concentration of the glass forming element can be at least 3%, 5% 10% or 20% higher than the concentration of the same elements in a BEOL dielectric interface in the device.

In some embodiments, the bonding surface(s) 402 may not be rinsed with water after being treated with the terminating fluid treatment 418 and direct bonding occurs. In other embodiments, however, the bonding surface(s) 402 may be rinsed with water after the terminating treatment 418 and before direct bonding occurs.

In embodiments where the bonding surfaces 402 are exposed to a terminating fluid treatment 418 that include at least one of boron and carbon, the concentration of at least one of boron and carbon at the bonding surface (and bonding interface of the bonded structure) can be higher than a nominal concentration at a back-end-of-line (BEOL) interface by at least 5%. For example, a concentration of boron at the bonding surface (or bond interface) can be greater than $1 \times 10^{13}$ atoms/cm$^2$, or greater than $2 \times 10^{13}$ atoms/cm$^2$.

In the illustrated embodiment, the terminating fluid treatment 418 is depicted as being sprayed onto the wafer 400 with dispersion device 416. However, this is merely an example and the skilled artisan will appreciate that the terminating fluid treatment 418 can be applied in other suitable methods. For example, in some embodiments, the wafers 400 can instead be dipped into the terminating fluid to expose the wafer(s) 400 to the terminating fluid vapor or fluid.

In some embodiments, after performing step 308, the treated wafer 400 can be dried without being rinsed by DI. The drying step may comprise spin drying the wafer 400 in a range of 1000 rpm to 4000 rpm and for a time in a range of 30 seconds to 240 seconds. Other drying processes and times may be used. In other embodiments, the treated substrate may be rinsed with DI before drying the substrate.

Figures 4D, 4E:
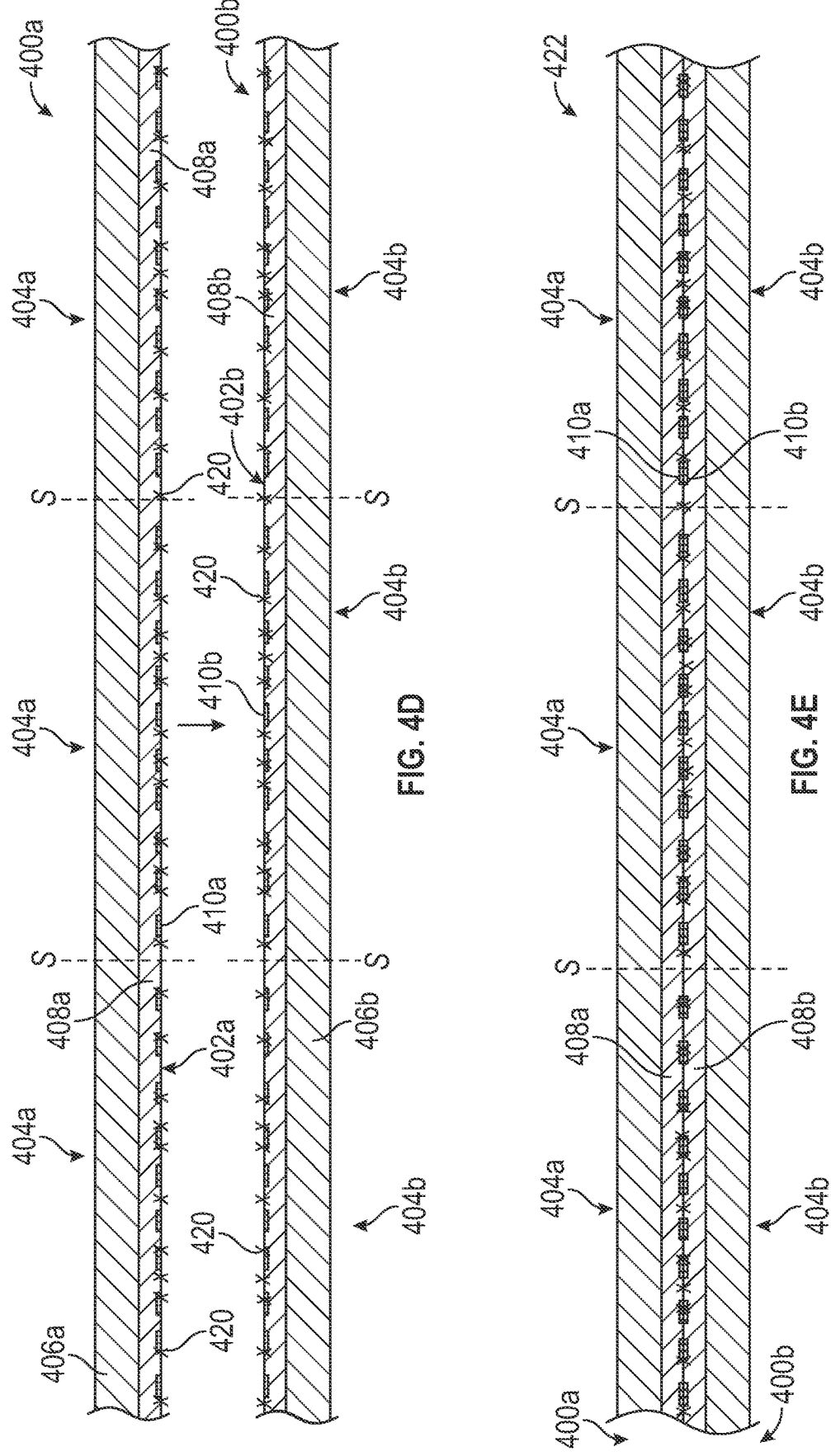

At step 310, after being treated with the terminating fluid treatment 418, the treated wafers 400 are directly bonded to each other to form a bonded device 422 without using an intervening adhesive. As shown in FIG. 4D, a first wafer 400a is positioned over a second wafer 400b. The first wafer 400a includes a first bonding surface 402a and a plurality of elements 404a, where each element 404a includes a base portion 406a, a nonconductive field region 408a, and a plurality of nonconductive contact features 410a at least partially embedded in the respective nonconductive field region 408a. Similarly, the second wafer includes a second bonding surface 402b and a plurality of elements 404b, where each element 404b includes a base portion 406b, a nonconductive field region 408b, and a plurality of conductive contact features 410b at least partially embedded in the nonconductive field region 408b. In the illustrated embodiment, both wafers 400a, 400b underwent the polishing process described above in connection with step 304, the etching/cleaning process described above in connection with step 306 and FIG. 4B, and the treating process described above in connection with step 308 and FIG. 4C. Accordingly, both first and second bonding surfaces 402a, 402b are terminated with the terminating species 420. In other embodiments, however, only one of the bonding surfaces 402a, 402b is terminated with the terminating species 420.

To bond the first and second wafers 400a, 400b together, the first and second wafers 400a, 400b can be positioned such that the first and second bonding surfaces 402a, 402b face each other and a first element 404a of the first wafer 400a is aligned with a second element 404b of the second wafer 400b. Specifically, the elements 404a and 404b can be aligned such that the conductive contact features 410a for the first element 404a are positioned directly over the conductive contact features 410b for the second element 404b and such that the nonconductive field region 408a for the first element 404a is aligned with the nonconductive field region 408b for the second element 404b. In this way, when the first and second wafers 400a, 400b are brought together to be directly bonded to each other, as shown in FIG. 4E, the nonconductive field regions 408a and 408b are in direct contact with each other and the conductive contact features 410a and 410b are directly aligned with each other.

Once the wafers 400a, 400b are aligned, the first and second elements 404a, 404b can be directly bonded to each other to form bonded device 422. The first and second nonconductive field regions 408a, 408b of the first and second elements 404a, 404b can be directly bonded to one another at room temperature using various direct bonding techniques such as those disclosed herein.

At step 312, after directly bonding the nonconductive field regions 408a, 408b together, in some embodiments the bonded device 422 can be annealed to increase a bond strength between the first and second bonding surfaces 402a, 402b. The annealing can be performed at a temperature in a range of 80° C. to 400° C., or in a range of 150° C. to 300° C. to increase the bond strength. The annealing can be performed for a time period in a range of 5 minutes to 120 minutes or in a range of 15 minutes to 45 minutes. After this anneal, the bond strength between the first and second bonding surfaces 402a, 402b can be in a range of 1000 mJ/mm$^2$ to 2500 mJ/mm$^2$, e.g., in a range of 1200 mJ/mm$^2$ to 2400 mJ/mm$^2$. The bond strength after the annealing step in the disclosed embodiments using the chemical treatment can be sufficiently strong for subsequent operations, for example, the grinding of the back surface of a wafer to thin the wafer from the backside, or thinning the backside of the wafer to reveal TSV for die stacking. Additionally or alternatively, the first and second elements 404a, 404b can be annealed in a subsequent anneal to cause the conductive contact features 410a, 410b to expand so as to form electrical connections between first and second pluralities of contact features.

FIG. 5A is a flow diagram of a first die-to-wafer (D2W) direct bonding process 500, according to various embodiments. FIGS. 6A-6H are schematic side sectional views showing various steps of the D2W process 500 of FIG. 5A. Unless otherwise noted, the features and steps of FIGS. 5A and 6A-6H may be the same as or generally similar to the features and steps shown in FIGS. 3 and 4A-4E. As shown in FIG. 6A, at step 502 of the process 500, a wafer 600 can be provided. The wafer 600 has a bonding surface 602 and includes a plurality of elements or dies 604. Each element 604 in the wafer 600 includes a base portion 606, a nonconductive field region 608, and a plurality of conductive contact features at least partially embedded in the nonconductive field region. The wafer 600 and elements 604 may be the same or generally similar to the wafer 400 and elements 404 shown in FIG. 4A.

At step 504, the bonding surface 602 of the singulated element 604 can be planarized and polished by a CMP process.

As shown in FIG. 6B, at step 506, a protective layer 614 is provided over the bonding surface 602. The protective layer 614 protects the bonding surface 602 and/or the conductive contact features 610 during singulation. In some embodiments, the protective layer 614 comprises a photosensitive resist, which can comprise an organic material. In other embodiments, the protective layer 614 comprises a non-photosensitive material which can be removed using chemicals such as Futurrex PC6 16000 or PC43-1500, sold by Futurrex, Inc. of Franklin, NJ. The wafer 600 with the protective layer 614 can be mounted on a dicing frame 612 with the protective layer 614 facing up, such that the backside of the wafer 600 opposite the bonding surface 602 is contacting the adhesive of the dicing frame 612.

As shown in FIG. 6B, at step 508, after providing the protective layer 614, the wafer 600 can be singulated into a plurality of elements or dies 604. Singulation can be performed using various singulation techniques and methods. Each singulated element 604 includes a base portion 606, a nonconductive field region 608, and at least one conductive contact features 610 at least partially embedded in the nonconductive field region 608. After singulation, the protective layer 614 may also still be on the bonding surfaces 602 of the elements 604.

Figures 6A, 6B:
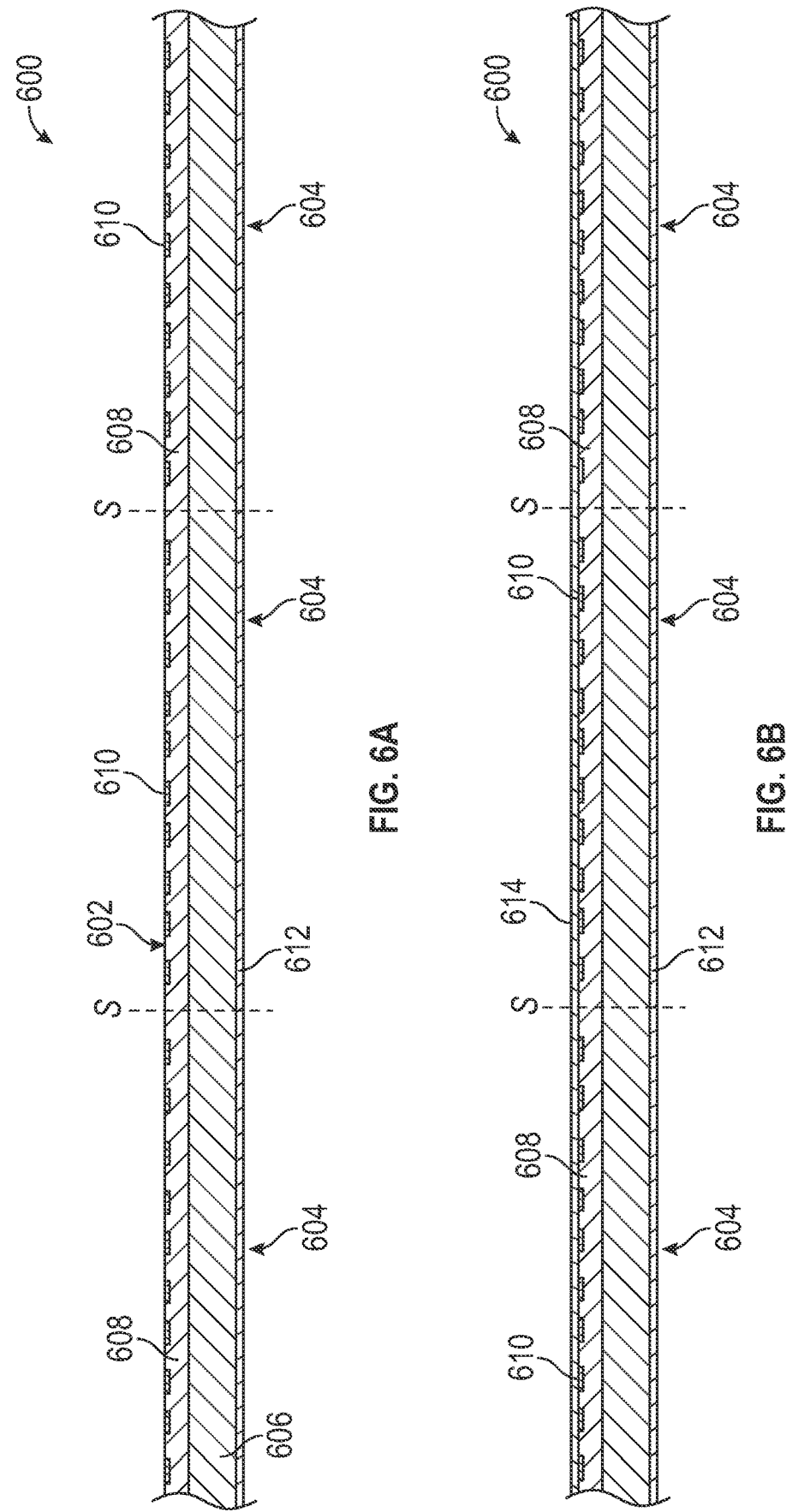
FIGS. 6A-6H are schematic side sectional views showing various steps of the die-to-wafer direct bonding process shown in FIG. 5A.
Figures 6C, 6D:
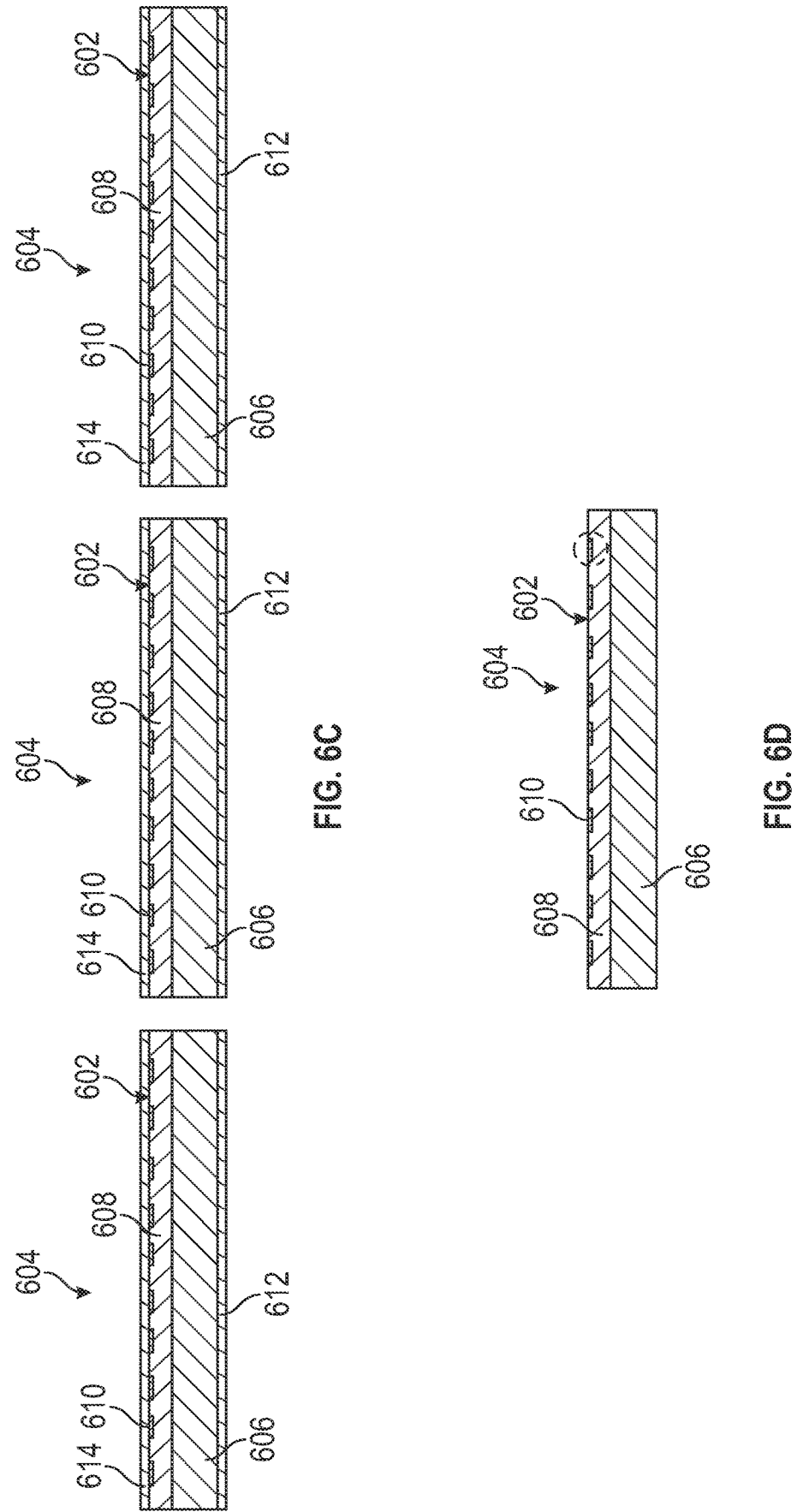

As shown in FIG. 6C, at step 510, the protective layer 614 is stripped from the bonding surface 602 of at least one of the singulated elements 604. In some embodiments, a suitable solvent is used to remove the protective layer 614. The suitable solvent may include a resist stripping solvent. In some embodiments, the now-exposed bonding surface 602 may also be rinsed with DI and dried. In the disclosed embodiments, the protective layer is removed from the dies or elements without exposing the element 604 to a plasma (e.g., without exposing the dies to an ashing or oxygen-containing plasma). For example, protective layers 614 can be removed by exposure to a liquid alkaline developer or by other protective layer stripping chemicals.

Figure 6E:
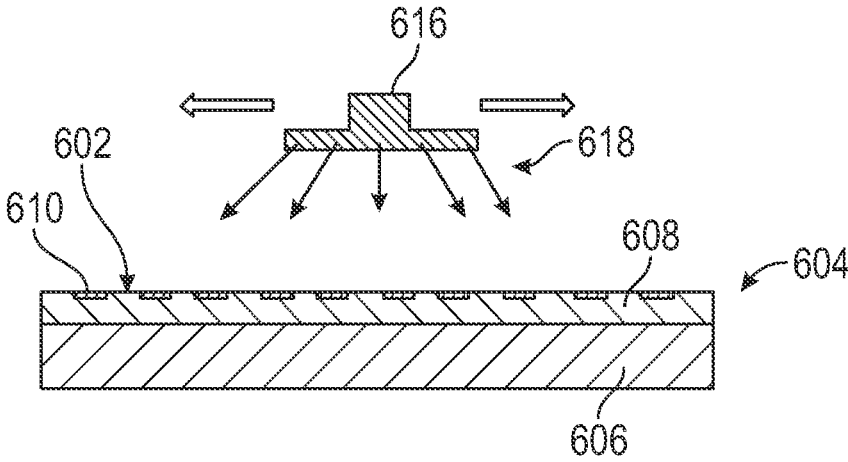

After singulating and polishing the element 604, any remaining protective layer residue and unwanted organic and inorganic debris (protective layer residues and particulates) can be cleaned from the surfaces (e.g., bonding surface and side walls) of the singulated element 604. As shown in FIG. 6E, at step 512, the bonding surface 602 of the element 604 is cleaned or very slightly etched with a liquid or vapor cleaning chemical 614. In some embodiments, the cleaning chemical 614 is dispersed over the bonding surface with a liquid dispersion device 616. As explained above in connection with FIG. 4B and step 306, a cleaning chemical 618 may be applied to prepare the bonding surface 602 for the chemical treatment step. The cleaning chemical 618 can be formulated to remove debris from the bonding surface 602 of the element 604 and, depending on the nature of the dielectric material that forms the nonconductive field region 608, the chemical 618 may slightly etch the surface of the nonconductive field region 608 and the conductive contact features 610. The cleaning process may not significantly degrade the smoothness of the bonding surface 602. 28 or example, the cleaning step may remove less than 10 nm from the surface of the substrate, less than 5 nm, or less than 0.5 nm.

In various embodiments, for example, the cleaning chemical 618 may comprise a very dilute buffered hydrofluoric acid (BHF) solution having a concentration in a range of 10 to 1000 ppm and preferably between 50 to 500 ppm. The cleaning chemical 618 may include one or more suitable surfactants to improve uniformity of cleaning across the bonding surface 602. In some embodiment, the chemical activity of the cleaning chemical 618 may be moderated by the incorporated alcohols, hydroxyalcohols, etc. Beneficially, using the cleaning chemical 618 to clean the bonding surface 602 can obviate the use of a plasma cleaning step (e.g., an ashing step) described in connection FIGS. 1 and 2, such that an oxygen-containing plasma is not used to clean the singulated dies on a dicing frame.

In some embodiments, more than one cleaning solution is used at step 512 to clean the bonding surface 602. For example, in some embodiments, water can be used in conjunction with the cleaning chemical 618 to clean the bonding surface 602. Specifically, the bonding surfaces 602 can be rinsed with DI. Alternatively, or in addition, step 512 may also incorporate a DI rinse and drying the substrate after the DI rinsing step.

Figure 6F:
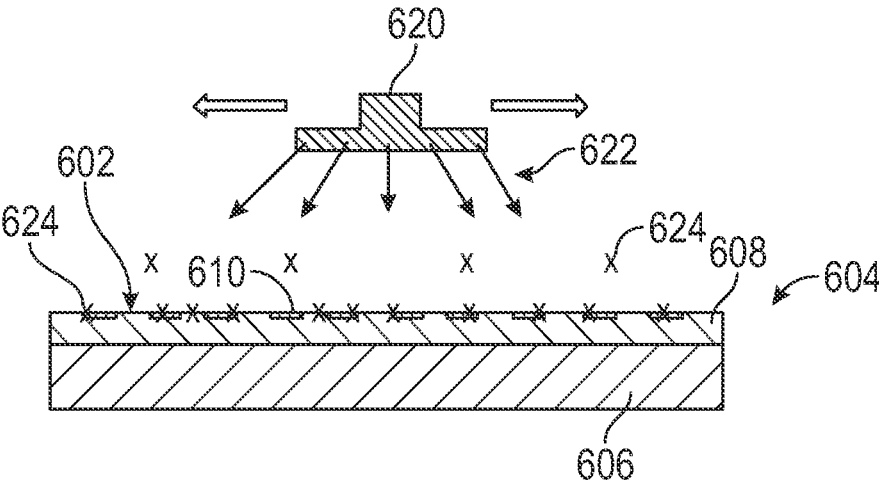

As shown in FIG. 6F, at step 514, the bonding surface 602 of the singulated die 604 is treated with a terminating fluid treatment 622 by a dispersion device 620 while the singulated dies 604 are still on the dicing sheet. The terminating fluid treatment 622 is performed to terminate the bonding surface 602 of the singulated dies 604 with a chemical bonding species 624, which can enhance bonding between the die and the host wafer. The use of a fluid (liquid or vapor) chemical treating species can obviate the use of a plasma in the direct bonding process, and can result in the bonding surface 602 being very clean, without unwanted debris and with a pad recess of less than 10 nm, e.g., a recess of about 4.3 nm.

By contrast, for nitrogen plasma treated singulated dies on a dicing frame, the plasma bombardment of the exposed surfaces of the dicing tape surface may transfer water insoluble organic residues from the dicing tape to the bonding surface of the die. The bonding surface of dies with organic dicing residues tend to exhibit low bonding energies when bonded to the prepared surface of a host substrate. In addition, the organic residues from the nitrogen activation step may contaminate the vacuum chamber of the plasma tool. This tool contamination results in contamination of all bonding surfaces processed in the chamber. The plasma chamber may be decontaminated by an extensive oxygen chamber ashing step, followed by wiping the interior of the plasma chamber. The plasma chamber may be requalified by a suitable method.

In the disclosed plasma-free embodiments, no nitrogen plasma process may be used before direct bonding surface preparation steps. In various embodiments, the bonding surface 602 of the singulated die may not be exposed to any plasma before direct bonding.

In the illustrated embodiment, the terminating fluid treatment 622 is depicted as being sprayed onto the element 604 with dispersion device 620. However, this is merely an example and the skilled artisan will appreciate that the fluid terminating treatment 622 can be applied to the element in other suitable methods. For example, in some embodiments, the singulated dies 604 can be dipped into the fluid treatment to expose the element 604 to the terminating vapor or fluid. In some embodiments, the terminating fluid may be applied between a megasonic transducer and the bonding surface of the element 604, where the megasonic transducer assists in cleaning and terminating the bonding surfaces.

In some embodiments, after performing step 514, the treated element 604 can be dried without being rinsed by DI. The drying step may comprise spin drying the frame or host between 1000 to 4000 rpm and for times varying from 30 seconds to 240 seconds. Other drying processes and times may be used. In other embodiments, the treated substrate may be rinsed with DI before drying the substrate.

After treating the singulated element 604, the element 604 can be directly bonded to a wafer. Accordingly, at step 516, a second semiconductor wafer is provided. The second semiconductor wafer may be prepared in a manner generally similar to that described above in connection with FIGS. 3 and 4A-4E. Specifically, the second semiconductor wafer can include a bonding surface that has been polished using a CMP process, cleaned or slightly etched, and then treated with a terminating fluid. Additionally, the second semiconductor wafer can be prepared without being exposed to plasma.

Figures 6G, 6H:
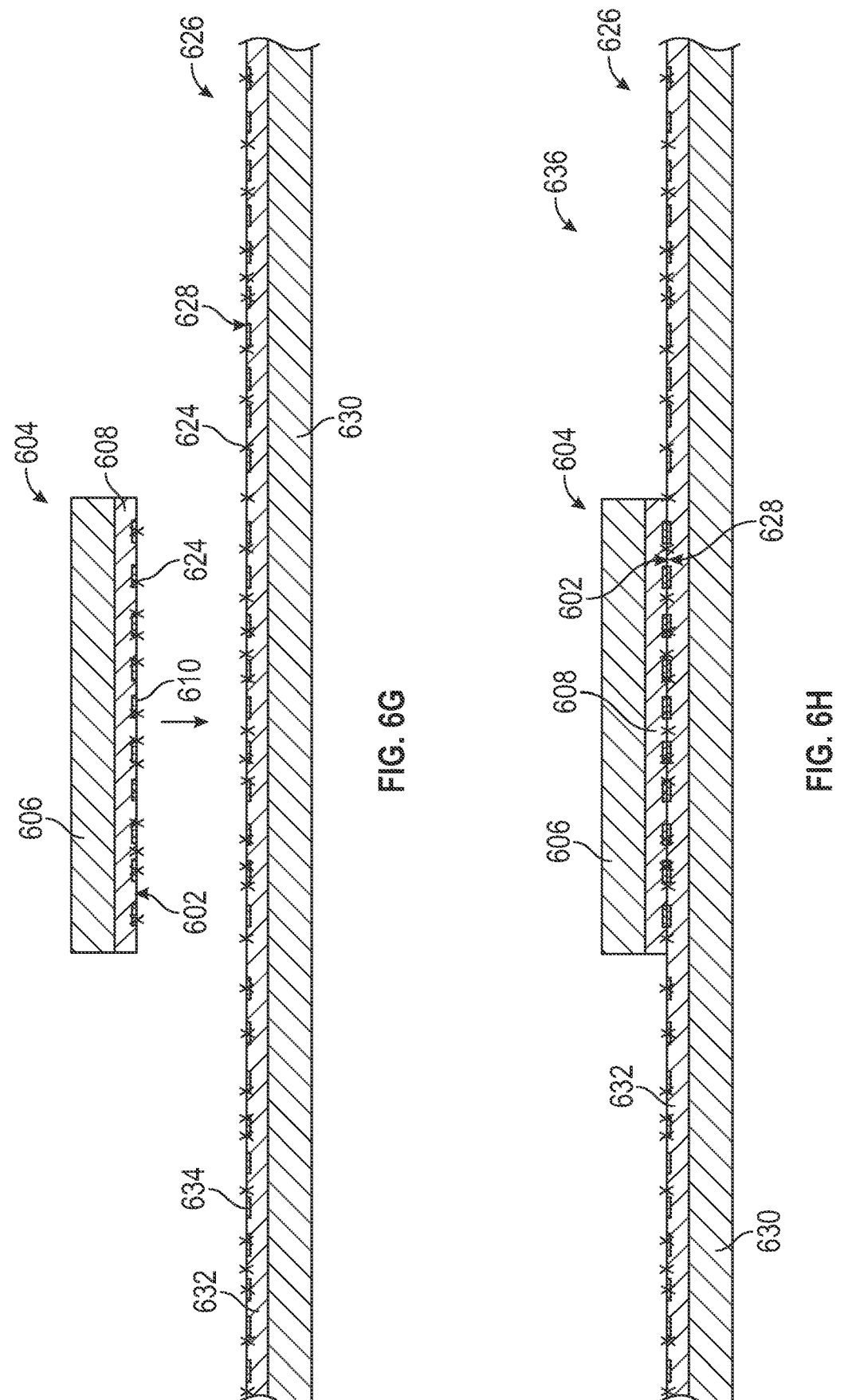

At step 518, the treated element 604 is directly bonded to the prepared wafer without using an intervening adhesive to form bonded device 636. As shown in FIG. 6G, the treated element 604 is positioned over the prepared wafer 626. The prepared wafer 626 includes a bonding surface 628, a base portion 630, a nonconductive field region 632, and plurality of conductive contact features 634 at least partially embedded in the nonconductive field region 632. In the illustrated embodiment, both bonding surfaces 602 and 628 were terminated with the terminating species 624. In other embodiments, however, only one of the bonding surfaces is terminated with the terminating species 624.

To bond the element 604 and the wafer 626, the element 604 and wafer 626 are positioned such that the bonding surfaces 602 and 628 face each other and the element 604 and wafer 626 are generally aligned with each other, although there may be some small misalignments. For example, the element 604 and wafer 626 can be generally aligned such that the conductive contact features 610 on the element 604 are positioned over the conductive contact features 634 of the wafer 626 and the nonconductive field region 608 for the element 604 is aligned with the nonconductive field region 632 for the wafer 626. In this way, when the element 604 and the wafer 626 are brought together to be directly bonded to each other, as shown in FIG. 6H, the nonconductive field regions 608, 632 are in direct contact with each other and the conductive contact features 610, 634 are directly aligned with each other.

Once the element 604 and the wafer 626 are generally or substantially aligned, the element 604 and the wafer can be directly bonded to each other to form bonded device 636. The nonconductive field regions 608, 632 of the die 604 and wafer 626 can be directly bonded to one another at room temperature using various bonding techniques.

At step 520, after the nonconductive field regions 608, 632 have been directly bonded together (for example, at room temperature), in some embodiments the bonded device 636 can be subsequently annealed to increase a bond strength between the first and second bonding surfaces 602, 628. The annealing can be performed at a temperature in a range of 100° C. to 400° C., or in a range of 150° C. to 300° C. to increase the bond strength. The annealing can be performed for a time period in a range of 15 minutes to 180 minutes. Higher temperature anneals can utilize shorter annealing times. The higher annealing temperature can induce expansion in the confined metal pads 610, 634 to mate and bond across a recess or gap, to form a mechanical and electrical joint, electrically interconnecting the die and the host wafer. The annealing process can result in excellent mechanical mating between the conductive layers of the element and the wafer.

In some embodiments, additional dies may be bonded by the disclosed methods to the wafer 626 or the backside of element 604. In some applications, the bonded structure may be singulated in such a manner that the element 604 are smaller in cross sectional that the wafer 626. In other embodiments the cross-sectional area of the singulated die stack may be similar to the area of the singulated host wafer.

Figure 5B:
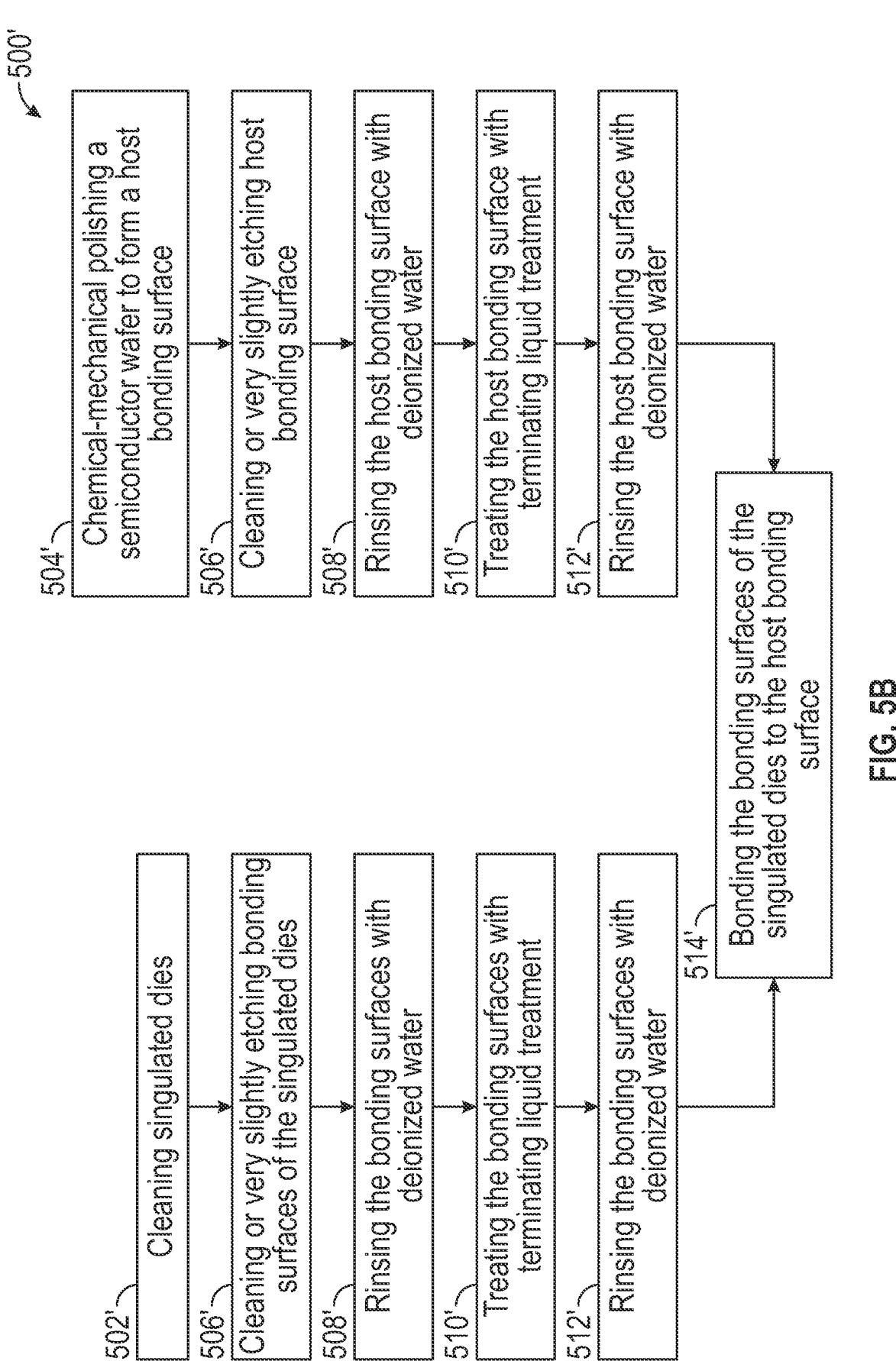

FIG. 5B depicts a second D2W direct bonding process 500', according to various embodiments. At step 502', one or more singulated dies are cleaned. At step 504', a semiconductor wafer is polished using a CMP technique to form a host bonding surface. At step 506', the bonding surfaces of the singulated dies and the host bonding surface are cleaned or very slightly etched. As described above in connection with step 512, the bonding surfaces are cleaned or etched with a cleaning chemical that is configured to prepare the bonding surfaces for a chemical treatment step by removing debris from the bonding surfaces and, in some embodiments, very slightly etching the bonding surfaces. At step 508', in some embodiments, the bonding surfaces of the singulated dies and the host bonding surface are rinsed with deionized water. At step 510', the bonding surfaces of the singulated dies and the host bonding surface are treated with a terminating liquid treatment. As described above in connection with step 514, the terminating liquid treatment is performed to terminate the bonding surfaces with a chemical bonding species, which can enhance bonding between the bonding surfaces of the singulated dies and the host bonding surface. At step 512', the bonding surfaces are rinsed with deionized water. At step 514', the bonding surfaces of the singulated dies are bonded to the host bonding surface. As described above in connection with step 518, the bonding surfaces of the singulated dies and the host bonding surface can be directly bonded together at room temperature without an adhesive and then annealed to strengthen the bond.

In one embodiment, a bonding method can include: providing a first element having a first bonding surface, the first bonding surface comprising a first nonconductive field region and a first plurality of contact features; providing a second element having a second bonding surface, the second bonding surface comprising a second nonconductive field region and a second plurality of contact features; slightly etching the first bonding surface of the first element with a liquid etchant to activate the first bonding surface; after the slightly etching, treating the first bonding surface with a terminating liquid treatment to terminate the first bonding surface with a terminating species; and after the treating, directly bonding the first bonding surface to the second bonding surface such that the first and second nonconductive field regions are directly bonded to one another without an intervening adhesive and such that the first and second pluralities of contact features are directly bonded to one another without an intervening adhesive.

In some embodiments, the first bonding surface of the first element is not exposed to an oxygen plasma before the direct bonding. In some embodiments, the first bonding surface of the first element is not exposed to a nitrogen plasma before the direct bonding. In some embodiments, the first bonding surface of the first element is not exposed to a plasma treatment after forming the first bonding surface and before the direct bonding. In some embodiments, slightly etching comprises exposing the first bonding surface to hydrofluoric acid (HF). In some embodiments, exposing the first bonding surface to HF comprises exposing the first bonding surface to a dilute HF solution having a concentration of HF in a range of 15 to 500 ppm. In some embodiments, treating the first bonding surface comprises treating the first bonding surface with tetramethylammonium hydroxide (TMAH). In some embodiments, treating the first bonding surface with TMAH comprises exposing the first bonding surface to a TMAH solution having a concentration of TMAH of less than 100 ppm. In some embodiments, exposing the first bonding surface to the TMAH solution comprises exposing the first bonding surface to the TMAH solution having a concentration of TMAH in a range of 5 ppm to 100 ppm. In some embodiments, treating the first bonding surface comprises treating the first bonding surface with a boron-containing solution. In some embodiments, treating the first bonding surface with the boron-containing solution comprises treating the first bonding surface with boric acid. In some embodiments, treating the first bonding surface with boric acid comprises treating the first bonding surface with a boric acid solution having a concentration of boric acid in a range of 0.5 ppm to 100 ppm. In some embodiments, treating the first bonding surface with the boron-containing solution comprises treating the first bonding surface with dimethylamine borane. In some embodiments, treating the first bonding surface with boric acid comprises treating the first bonding surface with a dimethylamine borane solution having a concentration of dimethylamine borane in a range of 0.5 ppm to 100 ppm. In some embodiments, treating the first bonding surface comprises treating the first bonding surface with a dilute solution containing ammonium and fluoride ions. In some embodiments, treating the first bonding surface comprises treating the first bonding surface with a glass-forming solution. In some embodiments, treating the first bonding surface with the glass-forming solution comprises treating the first bonding surface with a solution that comprises at least one of phosphorus, arsenic, boron, fluorine, carbon, or manganese. In some embodiments, treating the first bonding surface comprises treating the first bonding surface with a solution having a pH in a range of 6 to 10. In some embodiments, the first bonding surface is not rinsed with water after the treating and before the directly bonding.

In some embodiments, directly bonding comprises directly bonding the first and second nonconductive field regions at room temperature and, subsequently, annealing the first and second elements to increase a bond strength between the first and second bonding surfaces. In some embodiments, after the annealing, the bond strength between the first and second bonding surface is in a range of 400 mJ/mm2 to 2000 mJ/mm2. In some embodiments, after the annealing, the bond strength between the first and second bonding surface is in a range of 400 mJ/mm2 to 1800 mJ/mm2. In some embodiments, the method can include, after the annealing, further annealing the first and second elements to form electrical connections between the first and second pluralities of contact features. In some embodiments, the method can include slightly etching the second bonding surface of the second element with a liquid etchant to activate the second bonding surface; and after the slightly etching the second bonding surface, treating the second bonding surface with a terminating liquid treatment to terminate the second bonding surface with a terminating species. In some embodiments, the method can include polishing the first element to form the first bonding surface. In some embodiments, the method can include, before the slightly etching, providing a protective layer over a bonding surface of a wafer that includes the first element, the bonding surface including the first bonding surface. In some embodiments, the method can include, after providing the protective layer, singulating the wafer into a plurality of elements including the first element. In some embodiments, the method can include comprising removing the protective layer from the first element and cleaning the plurality of elements without exposing the first element to a plasma.

In another embodiment, a bonding method can include: providing a first element having a first bonding surface, the first bonding surface comprising a first nonconductive field region and a first plurality of contact features; providing a second element having a second bonding surface, the second bonding surface comprising a second nonconductive field region and a second plurality of contact features; treating the first bonding surface with a terminating liquid treatment to terminate the first bonding surface with a terminating species; and after the treating, directly bonding the first bonding surface to the second bonding surface such that the first and second nonconductive field regions are directly bonded to one another without an intervening adhesive and such that the first and second pluralities of contact features are directly bonded to one another without an intervening adhesive. The first bonding surface of the first element may not be exposed to an oxygen-containing plasma before the direct bonding.

In some embodiments, the first bonding surface of the first element is not exposed to a nitrogen-containing plasma before the direct bonding. In some embodiments, the method can include, before the treating, slightly etching the first bonding surface of the first element with a liquid etchant to activate the first bonding surface. In some embodiments, slightly etching comprises exposing the first bonding surface to hydrofluoric acid (HF). In some embodiments, the method can include, before the slightly etching, providing a protective layer over a bonding surface of a wafer that includes the first element, the bonding surface including the first bonding surface. In some embodiments, the method can include, after providing the protective layer, singulating the wafer into a plurality of elements including the first element. In some embodiments, the method can include removing the protective layer from the first element and cleaning the plurality of elements without exposing the first element to a plasma. In some embodiments, treating the first bonding surface comprises treating the first bonding surface with tetramethylammonium hydroxide (TMAH). In some embodiments, treating the first bonding surface comprises treating the first bonding surface with a boron-containing solution. In some embodiments, treating the first bonding surface with the boron-containing solution comprises treating the first bonding surface with boric acid. In some embodiments, treating the first bonding surface with the boron-containing solution comprises treating the first bonding surface with dimethylamine borane. In some embodiments, the first bonding surface of the first element is not exposed to a plasma treatment after forming the first bonding surface and before the direct bonding.

In another embodiment, a bonding method can include: providing a first element having a first bonding surface, the first bonding surface comprising a first nonconductive field region and a first plurality of contact features; providing a second element having a second bonding surface, the second bonding surface comprising a second nonconductive field region and a second plurality of contact features; treating the first bonding surface with a terminating liquid treatment to terminate the first bonding surface with a terminating species; and after the treating, directly bonding the first bonding surface to the second bonding surface such that the first and second nonconductive field regions are directly bonded to one another without an intervening adhesive and such that the first and second pluralities of contact features are directly bonded to one another without an intervening adhesive, wherein the first bonding surface of the first element is not exposed to a nitrogen-containing plasma before the direct bonding.

In some embodiments, the first bonding surface of the first element is not exposed to an oxygen-containing plasma before the direct bonding. In some embodiments, the method can include, before the treating, slightly etching the first bonding surface of the first element with a liquid etchant to activate the first bonding surface. In some embodiments, slightly etching comprises exposing the first bonding surface to hydrofluoric acid (HF). In some embodiments, treating the first bonding surface comprises treating the first bonding surface with tetramethylammonium hydroxide (TMAH). In some embodiments, treating the first bonding surface comprises treating the first bonding surface with a boron-containing solution. In some embodiments, treating the first bonding surface with the boron-containing solution comprises treating the first bonding surface with boric acid. In some embodiments, treating the first bonding surface with the boron-containing solution comprises treating the first bonding surface with dimethylamine borane. In some embodiments, the first bonding surface of the first element is not exposed to a plasma treatment after forming the first bonding surface and before the direct bonding.

In another embodiment, a bonding method can include: polishing a first bonding surface of a first element, the first bonding surface comprising a first nonconductive field region and a first plurality of contact features; after the polishing, cleaning the first bonding surface of the first element without exposing the first bonding surface to a plasma; and after the cleaning, treating the first bonding surface with a terminating liquid treatment to terminate the first bonding surface with a terminating species.

In some embodiments, the method can include polishing a second bonding surface of a second element, the second bonding surface comprising a second nonconductive field region and a second plurality of contact features; and after the treating, directly bonding the first bonding surface to the second bonding surface such that the first and second nonconductive field regions are directly bonded to one another without an intervening adhesive and such that the first and second pluralities of contact features are directly bonded to one another without an intervening adhesive. In some embodiments, cleaning the first bonding surface comprises slightly etching the first bonding surface. In some embodiments, slightly etching comprises exposing the first bonding surface to hydrofluoric acid (HF). In some embodiments, treating the first bonding surface comprises treating the first bonding surface with at least one of tetramethyl-ammonium hydroxide (TMAH), boric acid, solutions of ammonium ions and fluoride ions, and dimethylamine borane. In some embodiments, the first bonding surface of the first element is not exposed to a plasma treatment after polishing the first bonding surface and before the direct bonding.

In another embodiment, a bonding method can include: providing a protective layer to a bonding surface of a substrate; singulating the substrate and protective layer into a plurality of dies; removing the protective layer to expose a bonding surface of each die, the bonding surface of each die having a plurality of contact pads at least partially embedded in a nonconductive field region; and preparing the bonding surface of one or more dies for direct bonding without exposing the bonding surface of the one or more dies to a plasma.

In some embodiments, the die comprises a semiconductor integrated device die having active circuitry.

In another embodiment, a bonding method can include: singulating a substrate into a plurality of dies; and preparing a bonding surface of one or more dies for bonding without exposing the bonding surface of the dies to a plasma, the bonding surface of the one or more dies having a plurality of contact pads at least partially embedded in a nonconductive field region.

In some embodiments, the method can include coating the bonding surface of the one or more dies with a protective layer before the singulating and removing the protective layer after the singulating and before the preparing for bonding. In some embodiments, the protective layer comprises a photosensitive material.

In another embodiment, a device can comprise: a singulated substrate having a bonding surface formed without exposing the bonding surface to a plasma, wherein the bonding surface includes a plurality of contact pads at least partially embedded in a nonconductive field region.

In some embodiments, the bonding surface comprises at least one of phosphorus, arsenic, boron, fluorine, manganese nitrogen, carbon. In some embodiments, a concentration of at least one of boron and carbon at the bonding surface is higher than a nominal concentration at a back-end-of-line (BEOL) interface by at least 5%. In some embodiments, a concentration of boron at the bonding surface is greater than $1 \times 10^{13}$ atoms/cm$^2$. In some embodiments, the concentration of boron at the bonding surface is greater than $2 \times 10^{13}$ atoms/cm$^2$.

In another embodiment, a bonded device can include: a first substrate having a first bonding surface including a plurality of contact pads at least partially embedded in a first nonconductive field region; and a second substrate having a second bonding surface directly bonded to the first bonding surface of the first substrate, wherein a bonding interface between the first substrate and the second substrate comprises at least one of phosphorus, arsenic, boron, fluorine, manganese nitrogen, and carbon, and wherein a concentration of at least one of boron and carbon along the bonding interface is higher than the nominal concentration at a BEOL interface by at least 5%.

In some embodiments, the second substrate comprises a plurality of contact pads at least partially embedded in a second nonconductive field region. In some embodiments, the concentration of boron along the bonding interface is greater than $1 \times 10^{13}$ atoms/cm$^2$. In some embodiments, the concentration of boron along the bonding interface is greater than $2 \times 10^{13}$ atoms/cm$^2$.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A bonding method comprising:
providing a first element having a first bonding surface and a protective layer on the first bonding surface, the first bonding surface comprising a first nonconductive field region and a first plurality of contact features;
providing a second element having a second bonding surface, the second bonding surface comprising a second nonconductive field region and a second plurality of contact features;
removing the protective layer from the first element without exposing the first element to a plasma;
etching the first bonding surface of the first element with a liquid etchant to activate the first bonding surface;
after the etching, treating the first bonding surface with a terminating liquid treatment to terminate the first bonding surface with a terminating species; and
after the treating, directly bonding the first bonding surface to the second bonding surface such that the first and second nonconductive field regions are directly bonded to one another without an intervening adhesive and such that the first and second pluralities of contact features are directly bonded to one another without an intervening adhesive.

2. The bonding method of claim 1, wherein the first bonding surface of the first element is not exposed to a plasma treatment after the providing of the first element and before the direct bonding.

3. The bonding method of claim 1, wherein etching comprises exposing the first bonding surface to hydrofluoric acid (HF).

4. The bonding method of claim 3, wherein exposing the first bonding surface to HF comprises exposing the first bonding surface to a dilute HF solution having a concentration of HF in a range of 15 to 500 ppm.

5. The bonding method of claim 1, wherein treating the first bonding surface comprises treating the first bonding surface with tetramethylammonium hydroxide (TMAH).

6. The bonding method of claim 1, wherein treating the first bonding surface comprises treating the first bonding surface with a boron-containing solution.

7. The bonding method of claim 1, wherein treating the first bonding surface comprises treating the first bonding surface with a glass-forming solution.

8. The bonding method of claim 7, wherein treating the first bonding surface with the glass-forming solution comprises treating the first bonding surface with a solution that comprises at least one of phosphorus, arsenic, boron, fluorine, carbon, or manganese.

9. The bonding method of claim 1, wherein directly bonding comprises directly bonding the first and second nonconductive field regions at room temperature and, subsequently, annealing the first and second elements to increase a bond strength between the first and second bonding surfaces.

10. The bonding method of claim 1, further comprising:
etching the second bonding surface of the second element with a liquid etchant to activate the second bonding surface;
after the etching the second bonding surface, treating the second bonding surface with a terminating liquid treatment to terminate the second bonding surface with a terminating species.

11. A bonding method comprising:

providing a first element having a first bonding surface, the first bonding surface comprising a first nonconductive field region and a first plurality of contact features;

providing a second element having a second bonding surface, the second bonding surface comprising a second nonconductive field region and a second plurality of contact features;

treating the first bonding surface with a terminating liquid treatment that comprises a glass-forming solution to terminate the first bonding surface with a terminating species, wherein the glass-forming solution comprises one or more glass forming elements selected from the group that includes phosphorus, arsenic, boron, carbon, and manganese; and after the treating, directly bonding the first bonding surface to the second bonding surface such that the first and second nonconductive field regions are directly bonded to one another without an intervening adhesive and such that the first and second pluralities of contact features are directly bonded to one another without an intervening adhesive, wherein the first bonding surface of the first element is not exposed to a plasma before the direct bonding.

12. The bonding method of claim 11, wherein the first bonding surface of the first element is not exposed to a nitrogen-containing plasma or an oxygen-containing plasma before the direct bonding.

13. The bonding method of claim 11, further comprising, before the treating, etching the first bonding surface of the first element with a liquid etchant to activate the first bonding surface.

14. The bonding method of claim 13, wherein etching comprises exposing the first bonding surface to hydrofluoric acid (HF).

15. The bonding method of claim 11, wherein the glass-forming solution comprises a boron-containing solution.

16. The bonding method of claim 11, wherein the first bonding surface of the first element is not exposed to a plasma treatment after forming the first bonding surface and before the direct bonding.

17. A bonding method comprising:

polishing a first bonding surface of a first element, the first bonding surface comprising a first nonconductive field region and a first plurality of contact features;

after the polishing, providing a protective layer on the first bonding surface;

singulating the first element into a plurality of dies, wherein the plurality of dies comprises a first die that comprises a portion of the first bonding surface and a portion of the protective layer on the portion of the first bonding surface;

removing the portion of the protective layer to expose the portion of the first bonding surface and cleaning the portion of the first bonding surface of the first die without exposing the first bonding surface to a plasma; and after the cleaning, treating the portion of the first bonding surface with a terminating liquid treatment to terminate the portion of the first bonding surface with a terminating species.

18. The bonding method of claim 17, wherein the portion of the first bonding surface comprises a portion of the first nonconductive field region and a portion of the first plurality of contact features, the method further comprising:

polishing a second bonding surface of a second element, the second bonding surface comprising a second nonconductive field region and a second plurality of contact features; and after the treating, directly bonding the portion of the first bonding surface to the second bonding surface such that the portion of the first nonconductive field region and the second nonconductive field region are directly bonded to one another without an intervening adhesive and such that the portion of the first plurality of contact features and the second plurality of contact features are directly bonded to one another without an intervening adhesive.

19. The bonding method of claim 18, wherein the portion of the first bonding surface of the first element is not exposed to a plasma treatment after polishing the first bonding surface and before the direct bonding.

20. The bonding method of claim 11, wherein treating the first bonding surface comprises treating the first bonding surface with a glass-forming solution.

21. The bonding method of claim 1, wherein etching the first bonding surface of the first element comprises etching the first bonding surface of the first element after removing the protective layer from the first element.

22. The bonding method of claim 1, wherein removing the protective layer from the first element comprises cleaning the protective layer from the first element with the liquid etchant.

\* \* \* \* \*